United States Patent
Brummer et al.

(10) Patent No.: US 10,361,343 B2
(45) Date of Patent: Jul. 23, 2019

(54) ULTRAVIOLET LIGHT EMITTING DIODES

(71) Applicant: TRUSTEES OF BOSTON UNIVERSITY, Boston, MA (US)

(72) Inventors: Gordon C. Brummer, Brookline, MA (US); Denis M. Nothern, Watertown, MA (US); Theodore D. Moustakas, Dover, MA (US)

(73) Assignee: Trustees of Boston University, Boston, MA (US)

( * ) Notice: Subject to any disclaimer, the term of this patent is extended or adjusted under 35 U.S.C. 154(b) by 0 days.

(21) Appl. No.: 15/321,507

(22) PCT Filed: Jul. 2, 2015

(86) PCT No.: PCT/US2015/039090
§ 371 (c)(1),
(2) Date: Dec. 22, 2016

(87) PCT Pub. No.: WO2016/004374
PCT Pub. Date: Jan. 7, 2016

(65) Prior Publication Data
US 2017/0200865 A1    Jul. 13, 2017

Related U.S. Application Data

(60) Provisional application No. 62/020,119, filed on Jul. 2, 2014.

(51) Int. Cl.
*H01L 33/06* (2010.01)
*H01L 33/10* (2010.01)
(Continued)

(52) U.S. Cl.
CPC .............. *H01L 33/46* (2013.01); *H01L 33/06* (2013.01); *H01L 33/10* (2013.01); *H01L 33/145* (2013.01);
(Continued)

(58) Field of Classification Search
CPC ....... H01L 33/46; H01L 33/06; H01L 33/145; H01L 33/24; H01L 33/32; H01L 33/44; H01L 33/58
See application file for complete search history.

(56) References Cited

U.S. PATENT DOCUMENTS

| 6,373,188 B1* | 4/2002 | Johnson | H01L 33/505 |
| | | | 257/94 |
| 6,515,308 B1* | 2/2003 | Kneissl | H01S 5/18341 |
| | | | 257/104 |

(Continued)

OTHER PUBLICATIONS

Marked Enhancement in the Efficiency of Deep-Ultraviolet AlGaN Light-Emitting Diodes by Using a Multiquantum-Barrier Electron Blocking Layer, Hideki Hirayama, Yusuke Tsukada, Tetsutoshi Maeda, and Norihiko Kamata, Published Feb. 26, 2010 o © 2010 The Japan Society of Applied Physics.*

(Continued)

*Primary Examiner* — Mark W Tornow
(74) *Attorney, Agent, or Firm* — Donald I. Eisenstein; David F. Crosby

(57) ABSTRACT

The invention provides ultraviolet (UV) light-emitting diodes (LEDs). The UV LEDs can comprise abase layer including p-type SiC or p-type AlGaN, an active layer, and an n-AlGaN layer, wherein the active layer is disposed between the base layer and the n-AlGaN layer. In some embodiments, the absorption losses in p-SiC can be decreased or prevented by incorporating a conductive AlGaN Distributed Bragg Reflector (DBR) between the p-type SiC layer and the active layer. In some embodiments, the n-AlGaN layer can be textured to increase the extraction efficiency (EE). In some embodiments, the external quantum efficiency of the LEDs can be 20-30% or more.

19 Claims, 24 Drawing Sheets

EMBODIMENT 2
INVERTED LED WITH DBR

(51) Int. Cl.
  *H01L 33/14*  (2010.01)
  *H01L 33/24*  (2010.01)
  *H01L 33/32*  (2010.01)
  *H01L 33/44*  (2010.01)
  *H01L 33/46*  (2010.01)
  *H01L 33/58*  (2010.01)

(52) U.S. Cl.
  CPC .............. *H01L 33/24* (2013.01); *H01L 33/32* (2013.01); *H01L 33/44* (2013.01); *H01L 33/58* (2013.01)

(56)  References Cited

U.S. PATENT DOCUMENTS

2004/0104398 A1*  6/2004  Hon ...................... H01L 33/105
                                                           257/98
  2004/0206972 A1  10/2004  Erchak et al.
  2005/0156183 A1*  7/2005  Tsai ...................... H01L 33/105
                                                           257/96
  2008/0203407 A1   8/2008  Ahlstedt et al.
  2008/0240190 A1  10/2008  Kuramoto et al.
  2010/0308359 A1* 12/2010  Singh .................... H01L 33/007
                                                           257/98
  2012/0138995 A1   6/2012  Hwang
  2013/0292643 A1  11/2013  Kuo et al.
  2014/0054633 A1*  2/2014  Kim ...................... H01L 33/58
                                                           257/98
  2016/0211412 A1*  7/2016  Chiu .................... H01L 33/505

OTHER PUBLICATIONS

Increase in the extraction efficiency of GaN-based light-emitting diodes via surface roughening, T. Fujii, Y. Gao, R. Sharma, E. L. Hu, S. P. DenBaars and S. Nakamura, Appl. Phys. Lett. 84, 855 (2004).*

* cited by examiner

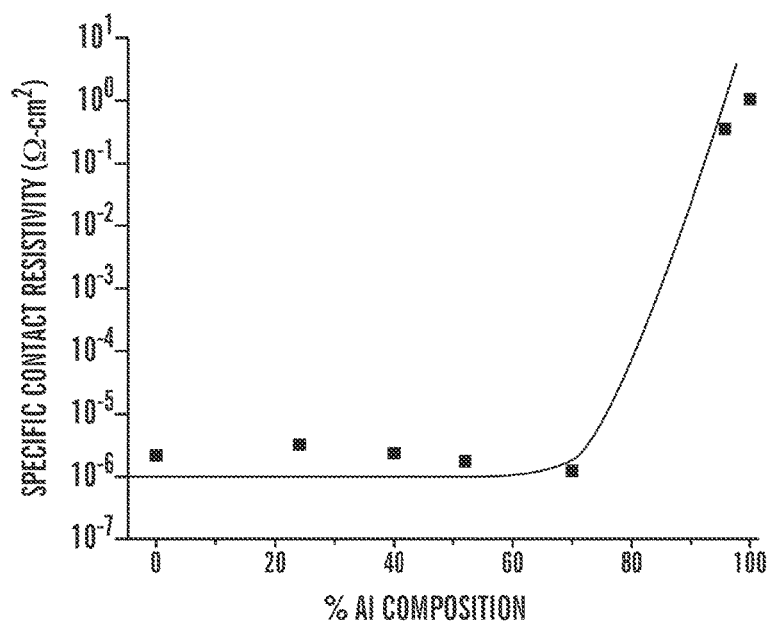
FIG. 8C
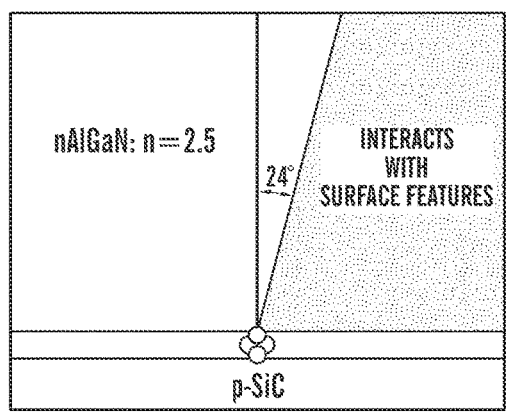 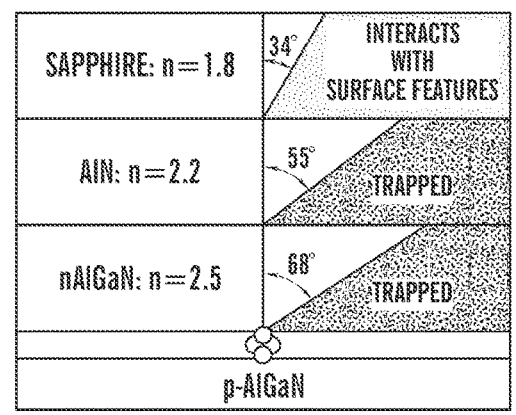
FIG. 9A  FIG. 9B

EMBODIMENT 3
INVERTED LED WITH DBR AND ARC

EMBODIMENT 4
VCSEL WITH 2 DBRs

EMBODIMENT 5
EAM WITH 2 DBRs

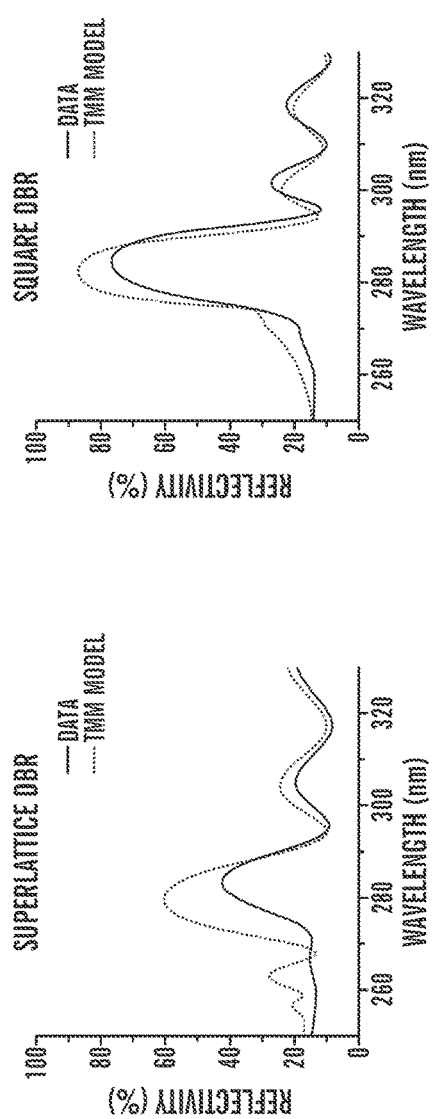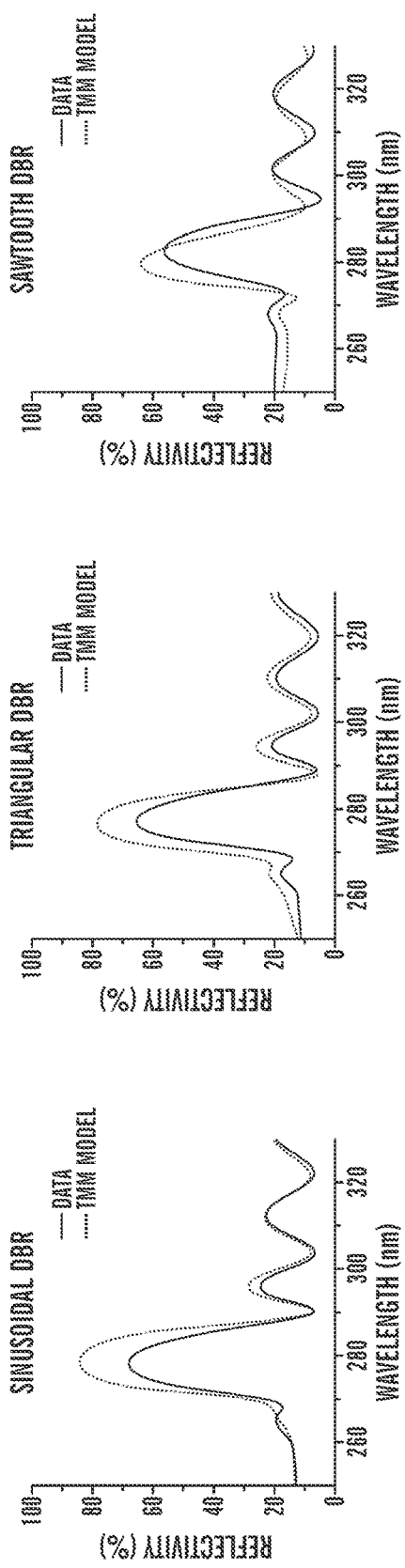

ULTRAVIOLET LIGHT EMITTING DIODES

CROSS-REFERENCE TO RELATED APPLICATIONS

This application is a 35 U.S.C. § 371 National Phase Entry Application of International Application No. PCT/US2015/039090 filed Jul. 2, 2015, which designates the U.S., and which claims benefit under 35 U.S.C. § 119(e) of U.S. Provisional Application No. 62/020,119 filed Jul. 2, 2014, the contents of each of which are incorporated herein by reference in their entirety.

STATEMENT REGARDING FEDERALLY SPONSORED RESEARCH

This invention was made with government support under Contract Nos. ECCS-1313625 and ECCS-1408364 awarded by the National Science Foundation (NSF). The government has certain rights in the invention.

REFERENCE TO MICROFICHE APPENDIX

Not Applicable

TECHNICAL FIELD

The present invention is directed to ultraviolet (UV) light emitting diodes (LED).

BACKGROUND

The GaN—AlN material system is well suited for UV optoelectronic devices, such as UV LEDs and UV Lasers, because its energy gap can be tuned by changing its alloy composition to cover all three regions of the UV electromagnetic spectrum: UV-A (340-400 nm), UV-B (290-340 nm) and UV-C (200-290 nm) [1-4]. Such semiconductor devices are expected to be lightweight, compact and have low power requirements. In addition, nitride semiconductors are physically robust, chemically inert, have high corrosion resistance and are non-toxic. These properties also make them attractive for use in hostile environments and at high temperatures. UV LEDs in particular are crucial for a number of applications such as UV photolithography, water/air purification, surface disinfection, free-space non-line-of-sight communication, epoxy curing, counterfeit detection and fluorescence identification of biological/chemical agents.

Despite intense efforts worldwide, the external quantum efficiency (EQE) of the majority of AlGaN based UV LEDs reported in the literature is generally 1-5% [5-12] and there is only a recent report of about 10% efficiency [9]. This is to be contrasted with blue LEDs based on InGaN alloys, whose EQE is as high as 60%. The EQE is defined as the product of the internal quantum efficiency (IQE), injection efficiency (IE) and extraction efficiency (EE). Thus, the poor EQE of deep UV-LEDs may be the result of poor IQE, IE, EE or a combination of all three factors. The IQE is the ratio of electron-hole pairs, which recombine radiatively, to those which recombine though all recombination routes (including radiative recombination). The IQE depends sensitively on extended and point defects, which act as non-radiative recombination centers. The IE is the ratio of electron-hole pairs arriving and recombining in the active region of the device to those injected in the n- and p-contacts from the power source. The EE is the ratio of photons extracted in the free space to those generated inside the device.

Currently, the majority of AlGaN-based deep UV-LEDs are grown on (0001) sapphire substrates [7-12, 24, 69, 70]. FIG. 1 shows the schematic of a typical deep UV LED grown on a sapphire substrate according to the prior art. For efficient heat sinking, the LEDs are generally flip-chip bonded with the p-side down onto appropriate heat conducting submount and the light is extracted from the sapphire side. The limitations of this LED structure are discussed below.

Due to the high lattice mismatch between AlGaN and sapphire (~14%), such devices suffer from high concentrations of threading defects, which lower their IQE [16]. Besides the high concentration of the threading defects, another source leading to poor IQE is the incorporation of oxygen in AlGaN. Oxygen impurities incorporate readily during growth of AlGaN films due to the high chemical affinity of aluminum for oxygen [14, 15]. Oxygen is known to introduce states in the center of the energy gap in AlGaN alloys with high AlN mole fraction, which are likely to be potent recombination centers.

The IE of UV LEDs is limited by the relatively poor doping efficiency of the p-AlGaN (low hole density) and the low diffusion length of the injected holes. Furthermore, careful design of the electron-blocking layer (EBL) is required to prevent electrons from escaping the active region and also to allow holes to reach the active region. In this respect, it should be pointed out that in devices such as the one shown in FIG. 1, the spontaneous-polarization and piezo-polarization produce an electric field in the electron blocking layer (EBL) and in the barriers of the quantum wells (QWs) that oppose hole injection into the active region.

One factor limiting the EE in UV LEDs on sapphire is absorption in the p-type layers, typically p-GaN. One approach to mitigate this absorption loss is by replacing the p-GaN with transparent p-AlGaN [28, 29]. This scheme was shown to give a 2× increase in output power [28]. In addition to the aforementioned absorption losses in the p-side, the EE in current UV LEDs is limited by losses associated with wave-guiding in the AlN buffer and the sapphire substrate as well as losses due to Snell's law as the light travels from the high index of refraction n-AlGaN sequentially to AlN buffer/sapphire/air. A potential solution to the poor EE is the removal of the sapphire substrate as well as the AlN buffer and texturing the n-AlGaN. However, such a process, while commonly practiced in blue LEDs using a laser lift-off process, is difficult in deep UV LEDs because they employ AlN buffer instead of GaN buffer. The AlN buffer does not absorb enough light from the processing laser to undergo thermal decomposition as the defective GaN buffer does in blue LEDs. In addition, such steps, even if they are possible, add to the cost of the devices.

There are a few references reporting an inverted device structure, based on InGaN QWs, emitting in the blue region of the spectrum, in which the p-GaN is deposited first on the sapphire substrates [37-39]. There are also a few reports of UV LEDs, grown on n-SiC [13]. However, it should be stressed that in these devices the SiC is not part of the device structure, and it only acts as a substrate for the epitaxial growth.

SUMMARY

The present invention is directed to UV LEDs based on AlGaN alloys grown on p-type substrates, such as p-SiC and p-AlGaN. In accordance with some embodiments of the invention, the growth can be in the [0001] direction. In accordance with some embodiments of the invention, UV LEDs in the spectral region of 210-365 nm can be produced. In accordance with some embodiments of the invention, the UV LEDs can produce deep UV light. In the UV LEDs described herein, the long standing problems of low internal quantum efficiency (IQE), low injection efficiency (IE), and low extraction efficiency (EE) are addressed, leading to devices with high efficiency.

In one aspect, the invention relates to a UV LED comprising: (a) a base layer including a p-type material forming a first side of the diode; (b) an active layer grown on the base layer, whereby radiative recombination of carriers in the active layer can produce ultraviolet light; and (c) an n-AlGaN layer grown on the active layer, wherein the n-AlGaN is on a second side of the diode which is opposite to the first side, and wherein the active layer is disposed between the base layer and the n-AlGaN layer.

In accordance with some embodiments of the invention, the p-type material can be SiC or AlGaN.

In accordance with some embodiments of the invention, the UV LED can further comprise a light-reflecting layer comprising at least one p-type electrically conductive AlGaN distributed Bragg reflector (DBR), wherein the light-reflecting layer is disposed between the base layer and the active layer, and whereby the p-type DBR effectively reflects the ultraviolet light away from the base layer.

In accordance with some embodiments of the invention, the p-type DBR can have a peak reflectance substantially similar to the wavelength of the ultraviolet light produced by the active layer.

In accordance with some embodiments of the invention, the p-type DBR can comprise a plurality of alternating first layers and second layers having different refractive indices, wherein the first layer and the second layer each comprises a plurality of alternating layers having different spontaneous polarizations.

In accordance with some embodiments of the invention, the p-type DBR can comprise a plurality of repeating layers, wherein each layer is graded in composition between at least two materials with different spontaneous polarizations.

In accordance with some embodiments of the invention, the UV LED can further comprise an electron-blocking layer disposed between the light-reflecting layer and the active layer. The electron-blocking layer can be p-doped or undoped.

In accordance with some embodiments of the invention, the active layer can substantially comprise AlGaN, InAlN, or InAlGaN.

In accordance with some embodiments of the invention, the active layer can comprise a single quantum well, a plurality of quantum wells, or a plurality of quantum dots.

In accordance with some embodiments of the invention, the n-AlGaN layer can comprise a textured surface, whereby light is emitted from the textured surface. The textured surface can be random or patterned (e.g., a micro lens array or photonic crystal).

In accordance with some embodiments of the invention, the UV LED can further comprise an n-type electrically conductive anti-reflective coating layer in contact with the n-AlGaN layer, such that the n-AlGaN layer is disposed in between the active layer and the anti-reflective coating layer.

In some embodiments, the UV LEDs can have IQE of at least 70%. The light can be extracted from the top n-AlGaN layer (using a vertical geometry with the p-side down), which can be textured without requiring the removal of the substrate in order to increase the EE to 70-80% or more. The LED can include a degeneratively doped p-SiC substrate structure with polarization enhanced injection of holes to produce a LED device having an IE of 50% or more. Thus, in accordance with some embodiments of the invention, the UV LEDs can have EQE of 20-30% or more.

The UV LEDs of the invention can have high IQE because of the better lattice matching of AlGaN to SiC (~1% mismatch) and p-AlGaN substrates, which can lead to films with lower dislocation density. Furthermore, the active region can be grown under a growth mode that has been demonstrated to promote band structure potential fluctuations and also to prevent incorporation of oxygen impurities [14, 15, 71]. These two factors can minimize non-radiative recombination and lead to devices with high IQE. In accordance with some embodiments of the invention, IQE as high as 70% can be achieved.

In accordance with some embodiments of the invention, the use of degenerately doped p-SiC substrates together with polarization enhanced injection of holes in the inverted (p-side down) structure along the [0001] direction can lead to devices with IE higher than 50%, e.g., at least 55%, at least 60%, at least 65%, at least 70%, at least 75%, at least 80%, at least 85%, at least 90%, or at least 95%.

In accordance with some embodiments of the invention, the surface of the n-AlGaN layer can be patterned or randomly textured to increase the extraction of light out of the device, thus increasing the EE. In accordance with some embodiments of the invention, a conductive UV AlGaN distributed Bragg reflectors (DBRs) can be disposed between the substrate (i.e., base layer) and the active region of the device to reduce absorption losses in the substrate, thus increasing the EE. In combination these two factors can lead to EE of 70-80%.

Thus, the UV LEDs of the invention can have EQE of 20-30% or more. In some applications, UV LEDs with high EQE are desirable. Some embodiments of the UV LEDs of the invention can have high power (not necessarily high efficiency), which are desirable in some applications.

Other advantages of some embodiments of the invention include the use of p-SiC substrates that are commercially available in large sizes, have high thermal conductivity and a lattice mismatch of high Al-content AlGaN alloys to SiC of only about 1%. Devices according to some embodiments of the invention can have a vertical geometry with the p-side down and thus do not require flip-chip bonding for thermal management due to high thermal conductivity of SiC. Furthermore, this geometry also reduces fabrication steps of existing devices, and can enable the fabrication of more LEDs per wafer.

Another aspect of the invention relates to an electrically conductive DBR comprising a plurality of alternating first layers and second layers having different refractive indices, wherein the first layer and the second layer each comprises a plurality of alternating layers having different spontaneous polarizations.

Yet another aspect of the invention relates to an electrically conductive DBR comprising a plurality of repeating layers, wherein each layer is graded in composition between at least two materials with different spontaneous polarizations.

Embodiments of the DBR can be n-type or p-type.

These and other capabilities of the invention, along with the invention itself, will be more fully understood after a review of the following figures, detailed description, and claims.

BRIEF DESCRIPTION OF THE FIGURES

The accompanying drawings, which are incorporated into this specification, illustrate one or more exemplary embodiments of the inventions and, together with the detailed description, serve to explain the principles and applications of these inventions. The drawings and detailed description are illustrative, and are intended to facilitate an understanding of the inventions and their application without limiting the scope of the invention. The illustrative embodiments can be modified and adapted without departing from the spirit and scope of the inventions.

FIG. 8C shows the measured specific contact resistivity of vanadium-based contacts as a function of AlN mole fraction.

FIG. 9A is a schematic showing the light extraction in a device where n-AlGaN is the only layer between the active region and air, as is possible with this invention.

FIG. 9B is a schematic showing the light extraction in a device where multiple films of different index of refraction between the active region and air, as is typically the case in the current generation of commercially available UV LEDs.

(FIG. 12A) Deep UV-LED flip chip device with the addition of a p-type polarization doped DBR type optical film preventing light absorption in the p-GaN layer. (FIG. 12B) A novel deep UV-LED device design utilizing a highly conductive but light absorbing p-SiC substrate, where light absorption is prevented by a p-type polarization doped DBR type optical film. (FIG. 12C) A deep UV-LED device as in (FIG. 12B) where an additional polarization doped ARC type optical film is present between the air-AlGaN interface to enhance the light extraction efficiency. (FIG. 12D) A novel vertical-cavity surface-emitting laser (VCSEL) design, similar to (FIG. 12C) where the top ARC is replaced with a DBR type optical film forming the laser optical cavity between the two DBRs. (FIG. 12E) A Fabry-Perot electroabsorption modulator where the optical cavity is formed by two conductive DBRs with high AN composition to minimize absorption.

FIG. 19A shows the measured and simulated reflectance spectra for one embodiment of the superlattice DBR. The reflectance measurements were taken using a CARY 5000 spectraphotometer, at near normal incidence (8 degrees), with an Al mirror as a reference.

FIG. 19B shows the measured and simulated reflectance spectra for an embodiment of a traditional DBR, where the compositional profile varies as a square wave. The reflectance measurements were taken using a CARY 5000 spectraphotometer, at near normal incidence (8 degrees), with an Al mirror as a reference.

FIG. 19C shows the measured and simulated reflectance spectra for on embodiment of the compositionally graded DBR, where the compositional profile varies as a sine wave. The reflectance measurements were taken using a CARY 5000 spectraphotometer, at near normal incidence (8 degrees), with an Al mirror as a reference.

FIG. 19D shows the measured and simulated reflectance spectra for on embodiment of the compositionally graded DBR, where the compositional profile varies as a triangular wave. The reflectance measurements were taken using a CARY 5000 spectraphotometer, at near normal incidence (8 degrees), with an Al mirror as a reference.

FIG. 19E shows the measured and simulated reflectance spectra for on embodiment of the compositionally graded DBR, where the compositional profile varies as a sawtooth wave. The reflectance measurements were taken using a CARY 5000 spectraphotometer, at near normal incidence (8 degrees), with an Al mirror as a reference.

DETAILED DESCRIPTION

The present invention is directed to the design and fabrication of UV LEDs, based on AlGaN alloys grown on conductive p-type substrates, such as p-SiC substrates or p-AlGaN substrates. In accordance with some embodiments of the invention, the UV LEDs can emit light in the UV spectral region of 210-365 nm. In accordance with some embodiments of the invention, the UV LEDs can emit light in the range of 250-300 nm.

The vast majority of the existing nitride devices are grown in the n-down configuration because severe Ohmic losses are incurred if mesas rely on the less conductive p-type material grown on a non-conductive substrate for lateral current spreading. This can be overcome in some embodiments of this invention, where the UV LED uses a vertical p-down geometry where there is no lateral current spreading or in mesa structure where the lateral current spreading occurs within the p-type substrate reducing Ohmic losses. In some embodiments of the p-down LED devices described herein, the different crystalline layers are grown along the [0001] direction, and the electric fields due to polarization created in the electron-blocking layer and quantum well barriers are along the direction of injection, thus enhancing injection efficiency.

In accordance with some embodiments of the invention, the UV LEDs can generate deep UV light. As used herein, the term "deep UV" refers to UV radiation in range of about 200 nm to about 300 nm. However, the teaching of the invention can be applicable to the generation of UV light in the entire UV spectrum.

Some embodiments of the invention relate to high efficiency UV LEDs. As used herein, the term "high efficiency" refers to an EQE of an UV LED of at least 10%, e.g., at least 15%, at least 20%, at least 25%, at least 30%, at least 35%, or at least 40%. In these embodiments, one or a combination of the following features can be implemented in the UV LED to increase EQE: a light-reflecting layer, an electron-blocking layer, an anti-reflective coating layer, and surface texturing. These features are described in detail below.

Some embodiments of the invention relate to high power UV LEDs. As used herein, the term "high power" refers to 10 mW or higher. SiC has high thermal conductivity, which can facilitate high power generation.

Figure 1:
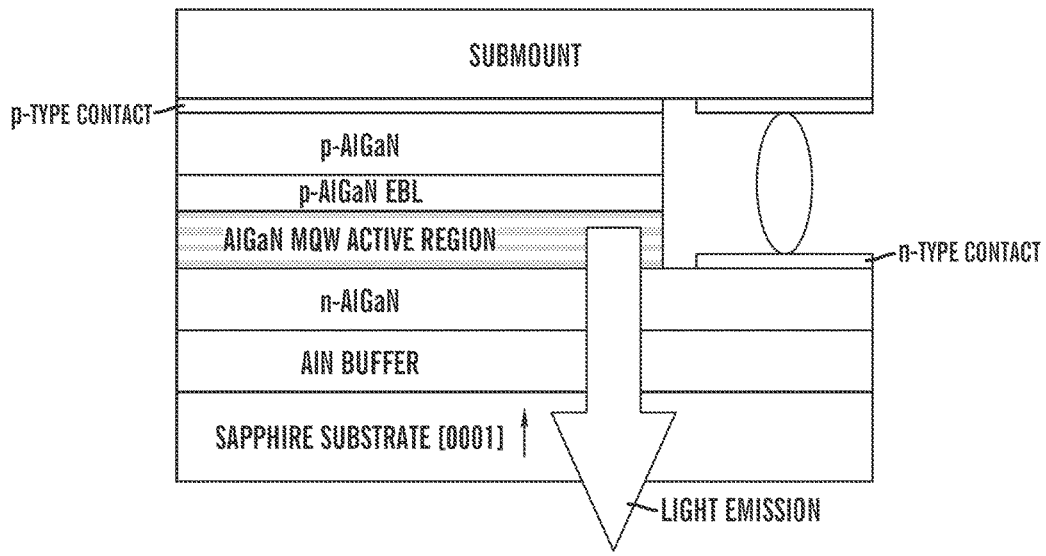
FIG. 1 is a schematic of commercially available flip-chip bonded UV LEDs, grown on a (0001) sapphire substrate.
Figure 2:
FIG. 2 is a schematic showing a cross section of a UV LED 100 in accordance with some embodiments of the invention.

FIG. 2 is a schematic showing a cross section of a UV LED 100 in accordance with some embodiments of the invention. The UV LED 100 can comprise a base layer 110 including a p-type material, an active layer 120, and an n-type AlGaN layer 130. The base layer 110 can form a first side of the UV LED 100. The n-type AlGaN layer 130 can form a second side of the UV LED 100 which is opposite to the first side. The active layer 120 can be disposed between the base layer 110 and the n-type AlGaN layer 130. The active layer 120 can be grown on (or otherwise applied to) the base layer 110. In accordance with some embodiments of the invention, the active layer 120 can be grown on the base layer 110 without any intermediate layer. In accordance with some embodiments of the invention, the active layer 120 can be grown on the base layer 110 with one or more intermediate layers provided in-between. As used herein, the term "grown on" expressly includes one or more optional intermediate layer(s) between the active layer 120 and the base layer 110. The term "grown on" is intended to also encompass the embodiments in which the active layer 120 is otherwise applied to the base layer 110 to produce the LED structure, with or without one or more intermediate layers.

To form an electrically complete circuit, the base layer 110 can have a first surface 112 in contact with a p-type contact layer, and the n-type AlGaN layer 130 can have a first surface 132 in contact with a n-type contact layer. The p-type contact layer and the n-type contact layer can be connected to a power supply. In accordance with some embodiments of the invention, the p-type contact layer can cover the entire back surface, ensuring uniform current density through the substrate. Without wishing to be bound by theory, holes from the base layer 110 and electrons from the n-type AlGaN layer 130 can migrate to the active layer 120, where they recombine to produce UV light. The p-type or n-type contact layer can each comprise a metal.

The base layer 110 is adapted to inject holes into the active layer 120. The p-type material of the base layer 110 can be SiC or AlGaN. In accordance with some embodiments of the invention, the base layer 110 can be a p-type SiC substrate. In accordance with some embodiments of the invention, the base layer 110 can be a p-type AlGaN substrate. The SiC or AlGaN can be degeneratively doped. The thickness of the base layer 110 can be in the range of 10-500 μm.

Typical p-type dopants for AlGaN include, but are not limited to, group II elements such as Be, Mg, and Ca. Contrary to the common belief that the p-AlGaN layers are more defective than n-AlGaN layers, there is evidence that the opposite is true. Specifically, Mg is a well-known surfactant used during the growth of nitride alloys, and thus during heteroepitaxy leads to films with larger domains. On the other hand, Si is an anti-surfactant and during heteroepitaxial growth leads to material with smaller domains. In accordance with some embodiments of the invention, the inverted structures with p-type films grown before the active region can lead to larger domains and consequently lower dislocation densities, since the dislocations occur at the boundaries of the domains due to their incomplete coalescence.

In accordance with some embodiments of the invention, the active layer 120 can substantially comprise AlGaN, InAlN, or InAlGaN. The active layer 120 can comprise one or a plurality of quantum wells (e.g., 2, 3, 4, 5, 6, 7, 8, 9, or more). The plurality of quantum wells (i.e., multiple quantum wells or MQW) can be connected in series in a direction perpendicular to the active layer 120 (i.e., the z direction shown in FIG. 2). The active layer 120 can also comprise a plurality of quantum dots or quantum discs (e.g., 2, 3, 4, 5, 6, 7, 8, 9, or more). The plurality of quantum dots can be arranged in a random or predetermined pattern. For example, the plurality of quantum dots can be arranged in a periodic pattern. In one embodiment, the periodic pattern is that of a lattice. Various lattice types are known to the skilled practitioner and can be used for the pattern of quantum dots. In one embodiment, the lattice is square. In one embodiment, the lattice is rectangular. In one embodiment, the lattice is triangular. In one embodiment, the lattice is hexagonal. The use of a non-periodic pattern, such as a pseudo-random pattern or a random pattern, is also envisioned. The thickness of the active layer 120 can be in the range of 2-500 nm, e.g., 2-400 nm, 2-350 nm, or 2-300 nm.

It is well known that nitride quantum wells grown along a polar direction suffer from the quantum confined Stark effect, which distorts the quantum wells and causes a red shift of the spectra and a decrease in the radiative efficiency of the wells due to the reduction of the overlap of the electron-hole wave functions. However, in the herein described inverted structure (p-side down), upon forward biasing, the externally applied electric field reduces the distortion of the quantum wells, leading to an increase in radiative recombination and thus, an increase in IQE.

The n-type AlGaN layer 130 is adapted to inject electrons into the active layer 120. In accordance with some embodiments of the invention, the n-type AlGaN layer 130 can have a thickness in the range of 500-3000 nm. In accordance with some embodiments of the invention, current spreading is afforded through at least one of: low sheet resistance n-AlGaN, low resistance Ohmic contacts, and large area backside contacts to the p-type substrate, allowing large areas of the top n-AlGaN layer to be left free of thick metal contacts and to be textured to increase the light extraction efficiency. In accordance with some embodiments, the top n-AlGaN layer can be textured to increase the extraction efficiency.

In accordance with some embodiments of the invention, there are no additional device layers between the n-AlGaN layer 130 and air. As a result, the aforementioned surface texturing is an efficient extractor of guided modes FIG. 9A. A portion of the generated light, in current sapphire-based UV LEDs, is trapped in internal device layers due to total-internal reflection. As shown in FIG. 9B, light incident on the AlN buffer from the n-AlGaN at angles greater than 68 degrees is reflected back towards the active region. Therefore, it does not pass to free-space, reducing the extraction efficiency. Similar situations exist between the AlN buffer and the sapphire, and the sapphire and air. Furthermore, texturing the sapphire can extract light trapped in the sapphire, however, it has a negligible effect on light trapped deeper in the device. This phenomenon accounts for the marginal increases and fundamentally limits extraction efficiency for UV LEDs utilizing surface texturing techniques. As shown in FIG. 9A, in the current invention there are no additional device layers between the n-AlGaN and air so no light is trapped in the internal device layers. Because of this, surface texturing on the present invention gives a larger increase to extraction efficiency. An added advantage of the device structure is the ease of implementation of the multitude of proven patterning techniques. As a result, a variety of techniques can be used for roughening and patterning the first surface 132 of the n-AlGaN layer.

The texture can be random or patterned. Examples of patterned textures include, but are not limited to, micro lens arrays and photonic crystals.

Without wishing to be bound by theory, roughening or patterning a planar interface can increase light output by providing generated photons lower incident angles and multiple reflections, thus reducing the number of photons which undergo total internal reflection. Alternatively, surface roughening with features such as micro lens arrays and photonic crystals on the order of the wavelength of the light can facilitate coupling between bound modes and radiation modes. It is well known in the art on how to design such photonic crystals for efficient coupling of guided modes to radiation modes. For example, see J. D. Joannopoulos et al., "Photonic Crystals: Molding the Flow of Light," $2^{nd}$ edition, Princeton University Press 2008. Relevant parameters for the design include, but are not limited to, the photonic crystal lattice type, lattice parameter, and cavity dimensions. Computer programs are readily available for performing simulations on photonic crystals to facilitate the design. These computer programs include, but are not limited to, a finite-difference time-domain program by Lumerical Inc., Meep by MIT, and the multiphysics software suite (particularly the Wave Optics Module) by COMSOL. A skilled artisan can perform such simulations without undue experimentation.

In accordance with some embodiments of the invention, the first surface 132 can be in contact with an n-type electrically conductive anti-reflective coating (ARC) layer, such that the n-type AlGaN layer 130 is disposed in between the active layer 120 and the ARC layer. The terms "anti-reflective coating" or "ARC" as used herein, refer to any material with a periodic or semi-periodic index of refraction tuned for at least one desired peak in transmission. The term "semi-periodic" as used herein to describe a material's index of refraction that is nominally periodically changing in space, but has regions that deviate from the nominal period (or a harmonic of that period) by as much as 50% (for example, a chirped sine wave, frequency modulation), and/or regions that deviate from the nominal amplitude of the index of refraction change (for example, a beating sine wave such as amplitude modulation).

Some p-type materials such as SiC and GaN can absorb UV light. On the other hand, $Al_xGa_{1-x}N$ alloys with high AN mole fraction (for example $x \geq 0.5$) have minimal deep ultra violet light absorption. In accordance with some embodiments, to decrease or prevent light absorption by the p-type material of the base layer 110, a light-reflecting layer can be disposed between the base layer 110 and the active layer 120 and adapted to reflect light generated in the active layer 120 away from the base layer 110. The light-reflecting layer can thus help increase the EQE of the LED. In accordance with some embodiments of the invention, the light-reflecting layer can comprise at least one p-type electrically conductive AlGaN distributed Bragg reflector (DBR). The terms "distributed Bragg reflector" or "DBR" are used herein to refer to any material or structure with a periodic or semi-periodic index of refraction tuned for at least one desired peak in reflectivity. Detailed description of DBRs can be found in the DBR section below.

In accordance with some embodiments of the invention, the p-type contact layer in contact with the base layer 110 can reflect the light generated in the active layer 120. This is particularly useful in embodiments where a light-reflecting layer is not present. The reflectivity of the p-type contact layer can be at least 50%, such as at least 60%, at least 70%, at least 80%, at least 90%, or at least 95%. Larger reflectivity can lead to higher EQE. The reflective p-type contact layer can comprise a conductive material (e.g., aluminum, silver) that can reflect UV light. An example of reflective p-type contact can be seen in Max Shatalov, et al., Applied Physics Express, 5(8):082101, 2012, the contents of which are incorporated herein by reference.

In accordance with some embodiments of the invention, the UV LED 100 can further comprise an electron-blocking layer (EBL) disposed between the base layer 110 and the active layer 120. The electron-blocking layer is adapted to block electrons from leaving the active region of the device. While in traditional UV LEDs grown on sapphire substrates with the n-side down the electron blocking layer in general introduces a barrier to hole transport from the p-AlGaN to the active region of the device, in the present invention with the p-side down hole transport from the p-substrate to the active region is aided by the polarization-induced electric field in the electron-blocking layer. In accordance with some embodiments of the invention, the electron-blocking layer can be undoped. The inventors have surprisingly discovered that holes can still be injected into the active layer 120 when an undoped AlN electron-blocking layer is used. In accordance with some embodiments of the invention, the electron-blocking layer can comprise AlGaN. The AlGaN can be a graded composition. In accordance with some embodiments of the invention, the electron-blocking layer can be doped p-type. Due to the very high activation energy of many p-type dopants in high AlN mole fraction AlGaN alloys, dopant ionization in the electron-blocking layer will largely occur due to the polarization field, as opposed to thermal activation.

In accordance with some embodiments of the invention, the electron-blocking layer can be disposed between the light-reflecting layer and the active layer 120.

Figure 3:
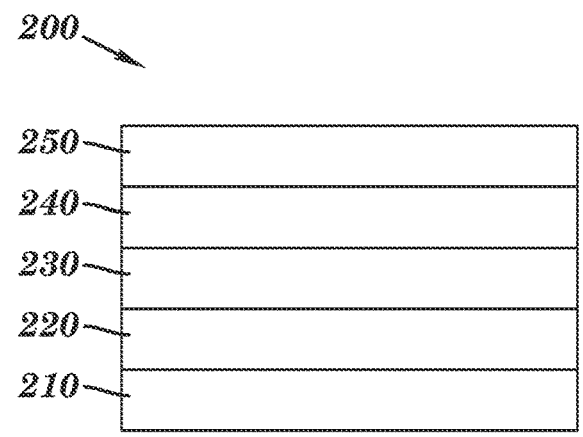
FIG. 3 is a schematic showing a cross section of a UV LED 200 in accordance with some embodiments of the invention.
Figure 4A:
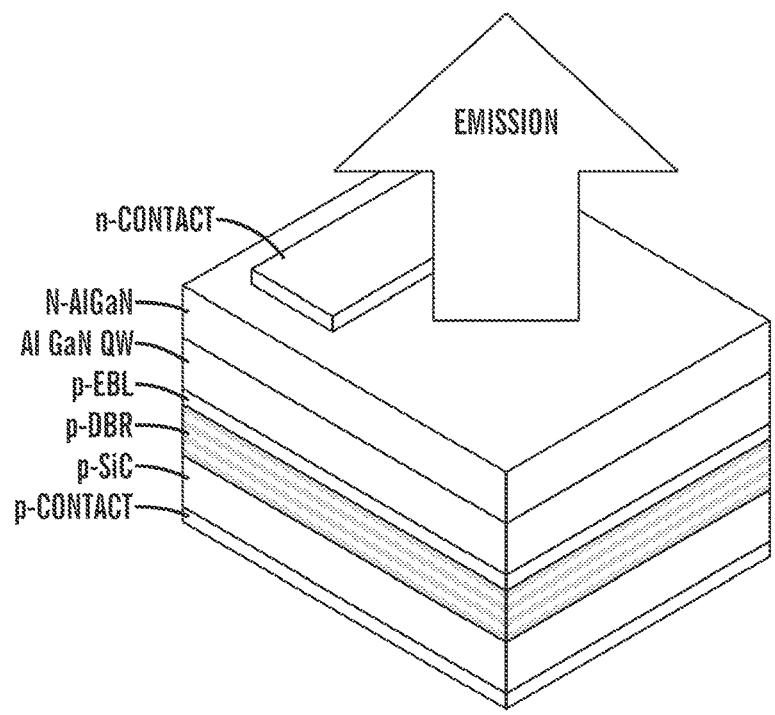
FIG. 4A is a schematic of a UV LED on p-SiC according to some embodiments of the invention.
Figure 4B:
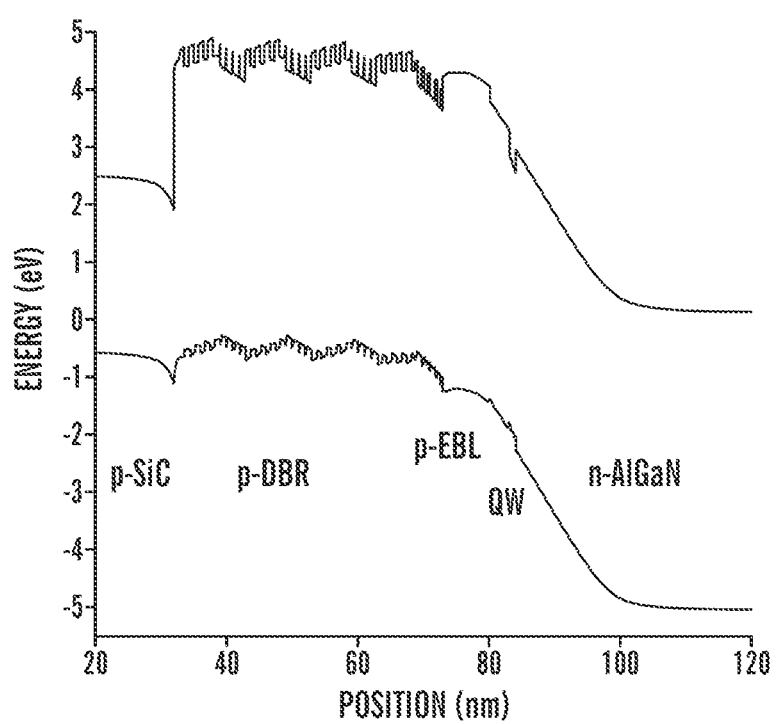
FIG. 4B shows simulated (using NextNano) equilibrium band structure of the UV LED design according to some embodiments of the invention.
Figure 5A:
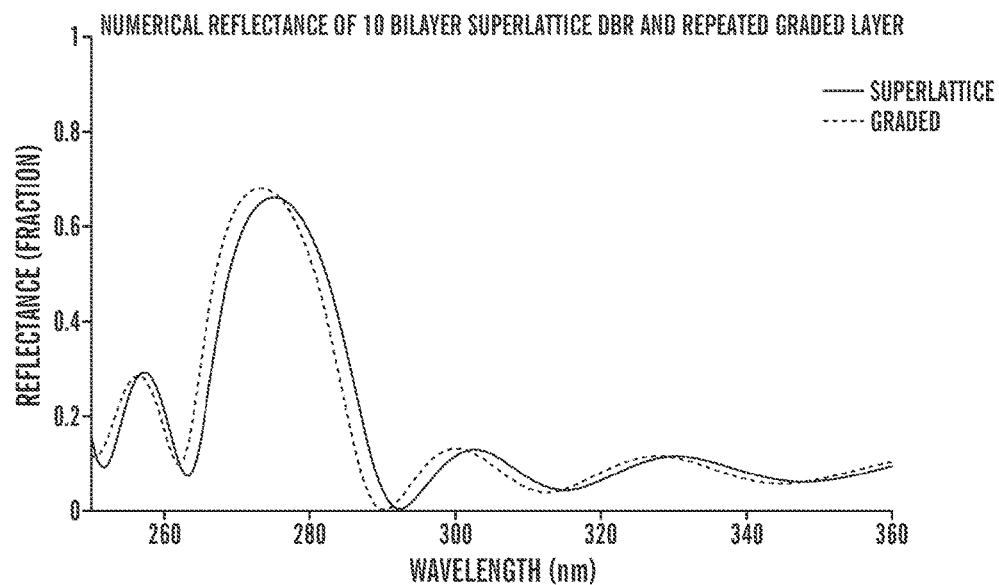
FIG. 5A shows the reflection properties calculated using the transfer matrix method (TMM) for a 10-bilayer superlattice DBR according to some embodiments of the invention and a repeated compositionally graded layer (10 layers).
Figure 5B:
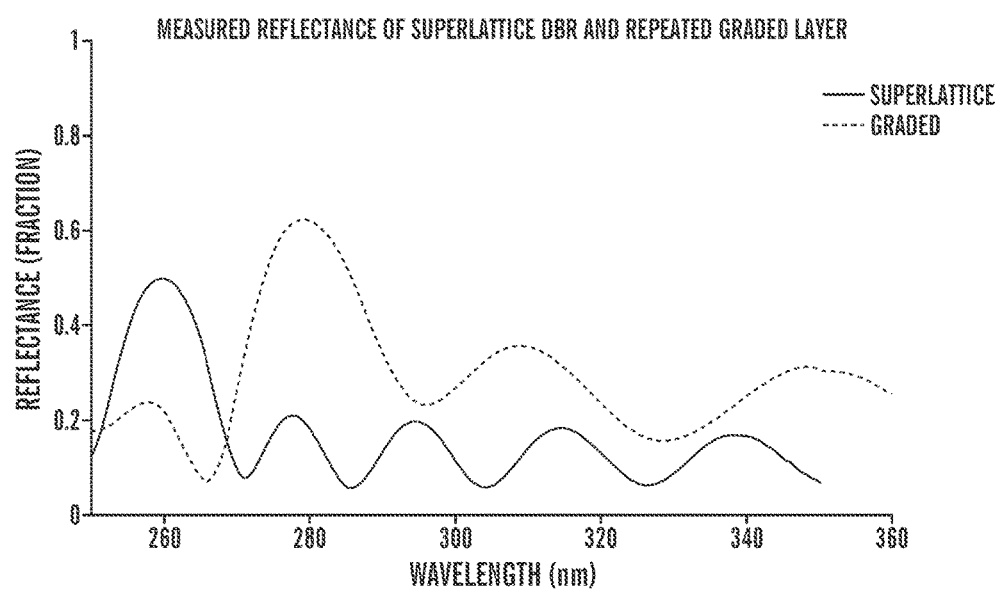
FIG. 5B shows the reflection properties measured for a 15-bilayer superlattice DBR according to some embodiments of the invention and 8 layer compositionally graded structure.
Figure 6A:
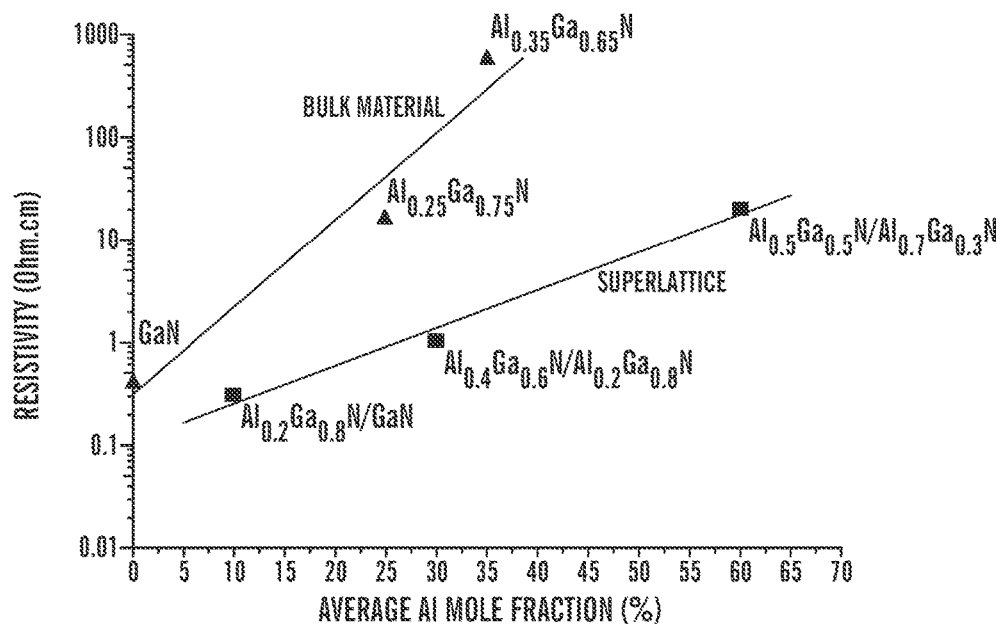
FIG. 6A shows resistivity vs AlN mole fraction for bulk AlGaN films and polarization doped AlGaN superlattices.
Figure 6B:
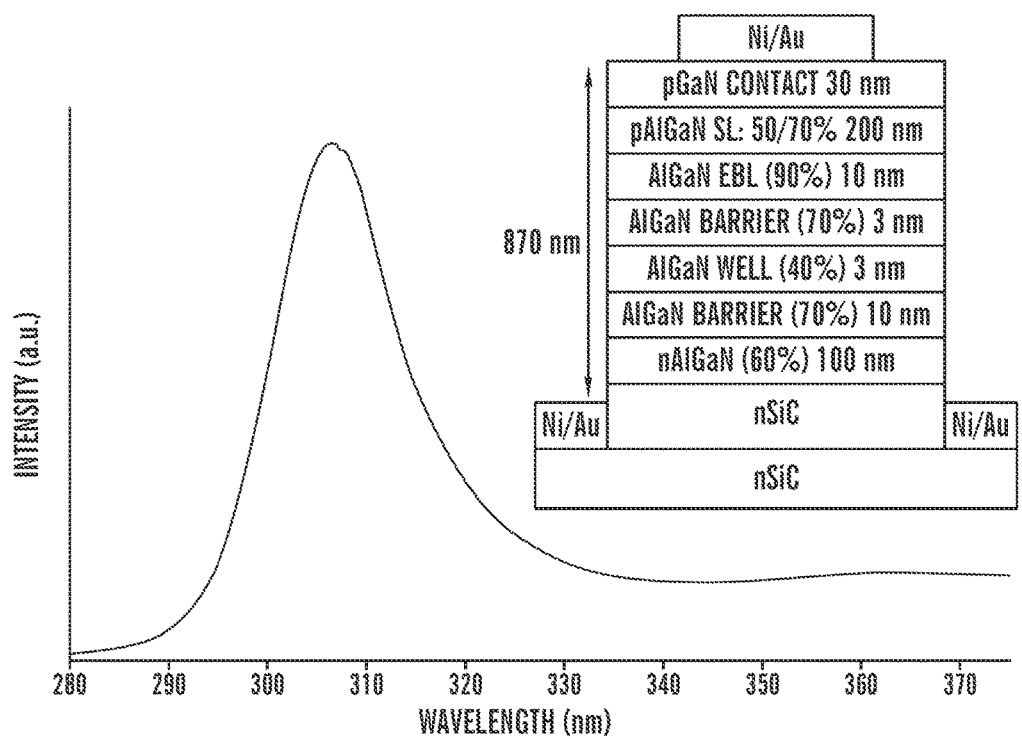
FIG. 6B shows the electroluminescence spectrum from the LED described in the inset panel. The inset shows a schematic diagram of a top emitting UV LED grown on n-SiC, utilizing a transparent p-AlGaN superlattice layer.
Figure 7A:
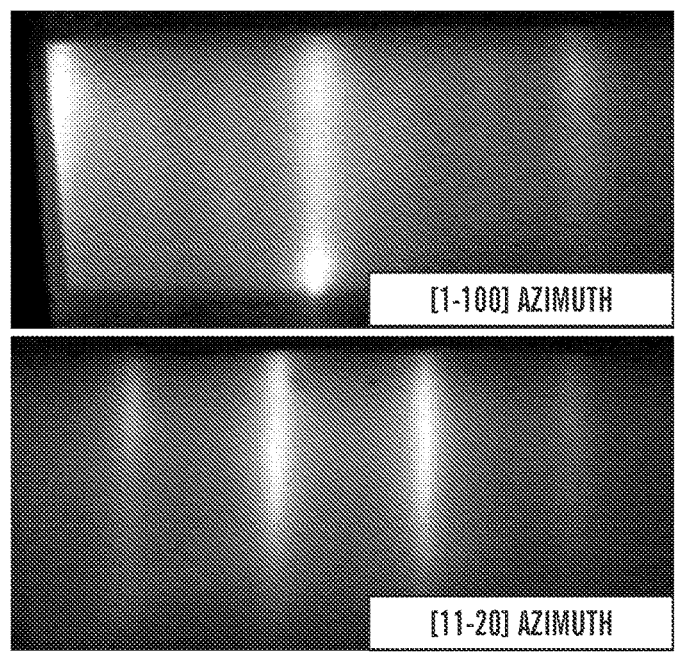
FIG. 7A shows a reflection high-energy electron diffraction (RHEED) pattern of an AlN film grown at 850° C. directly on 6H-SiC substrate.
Figure 7B:
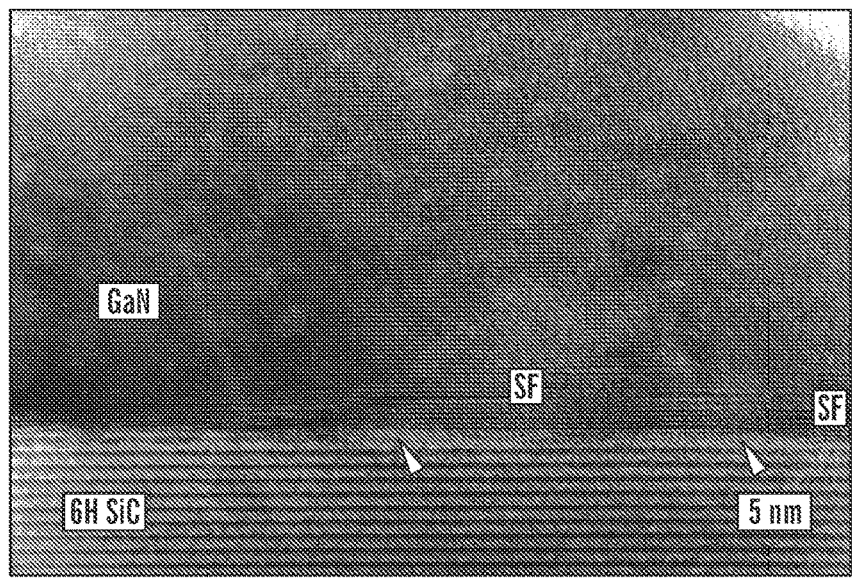
FIG. 7B shows a high resolution transmission electron microscopy (TEM) image of a GaN film grown directly on 6H-SiC without any buffer.
Figure 7C:
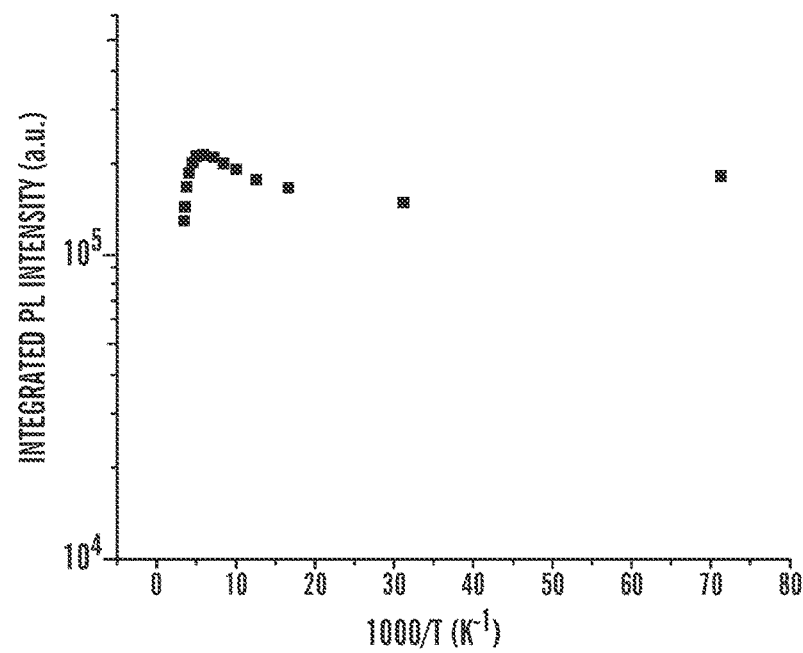
FIG. 7C shows integrated PL intensity vs 1/T for $Al_{0.7}Ga_{0.3}N$/AlN MQWs grown on 6H-SiC substrates.
Figure 7D:
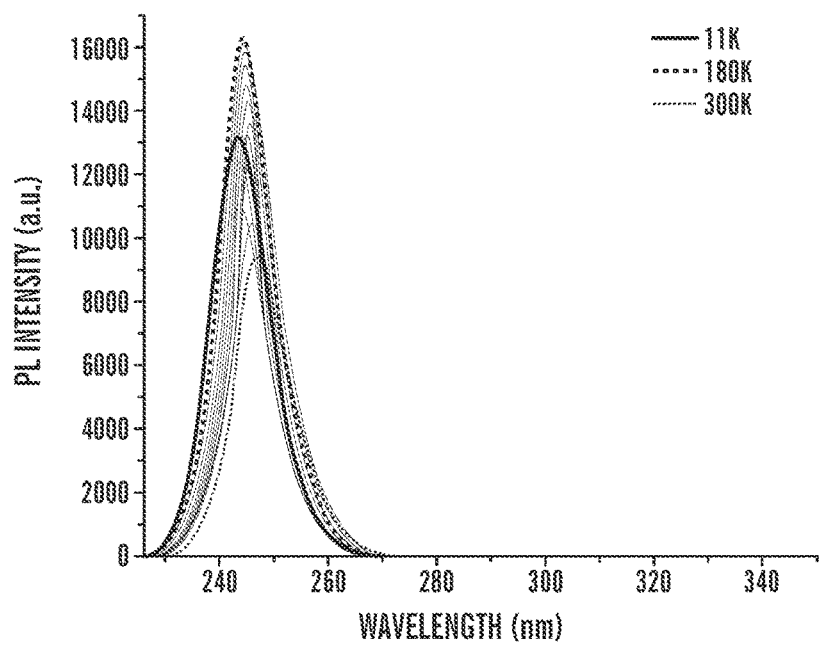
FIG. 7D shows the corresponding PL spectra at various temperatures.
Figure 8A:
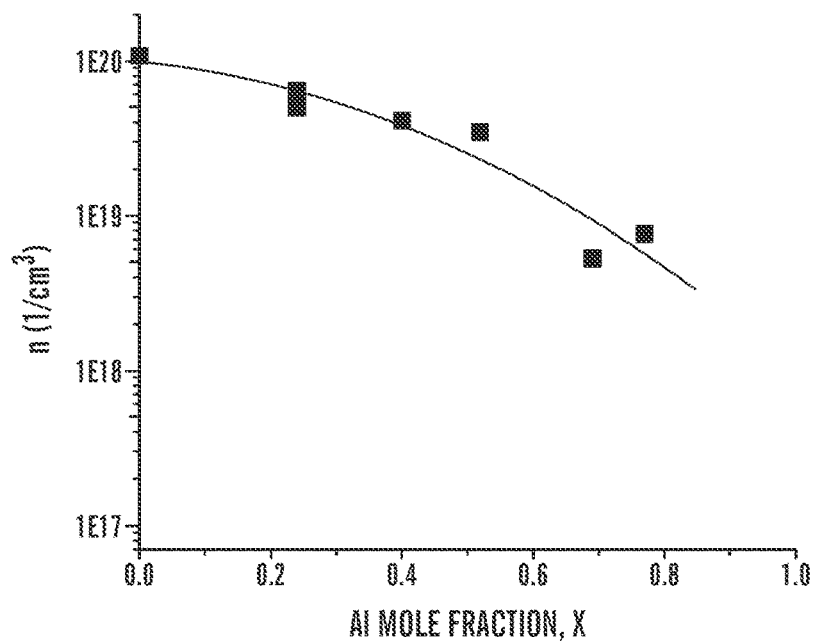
FIG. 8A shows the measured electron concentration.
Figure 8B:
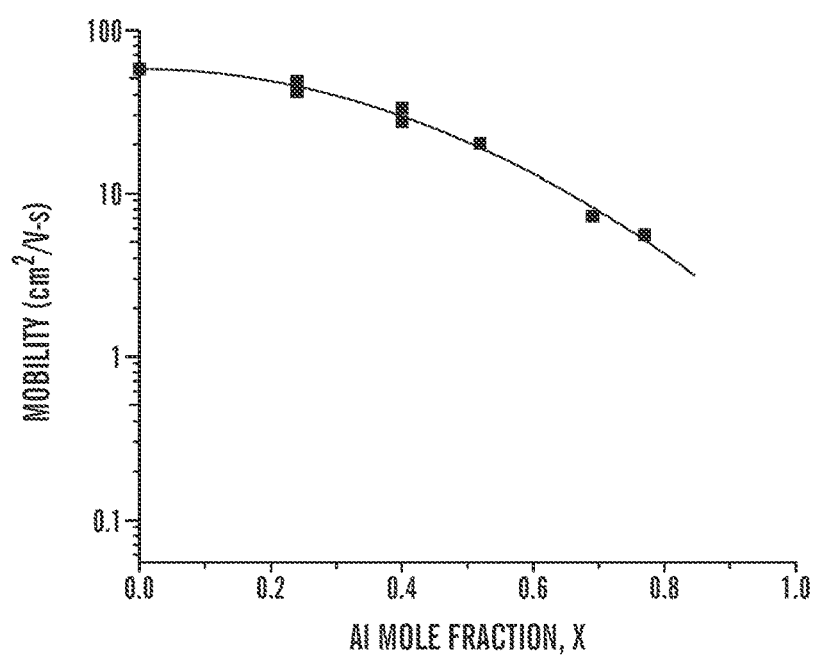
FIG. 8B shows the mobility of n-AlGaN films for varying AlN mole fractions.

FIG. 3 is a schematic showing a cross section of a high-efficiency UV LED 200 in accordance with some embodiments of the invention. The UV LED 200 can comprise a base layer 210 including a p-type material, optionally a light-reflecting layer 220, an electron-blocking layer 230, an active layer 240, and an n-type AlGaN layer 250. The light-reflecting layer 220 is needed if the p-type material can absorb UV light. The light-reflecting layer 220 can be optional if the p-type material minimally absorb UV light.

The base layer 210 can form a first side of the UV LED 200. The n-type AlGaN layer 250 can form a second side of the UV LED 200 which is opposite to the first side. The optional light-reflecting layer 220 can be disposed between the base layer 210 and the electron-blocking layer 230. The electron-blocking layer 230 can be disposed between the light-reflecting layer 220 and the active layer 240. The active layer 240 can be disposed between the electron-blocking layer 230 and the n-type AlGaN layer 250.

Figure 14B:
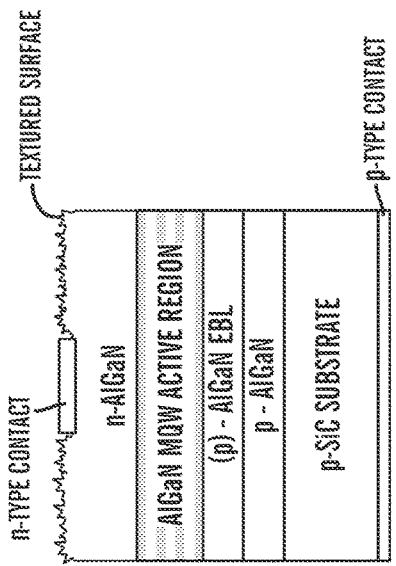
FIGS. 14A-14D are schematics of UV LEDs on p-SiC according to some embodiments of the invention. "(p)" means that the AlGaN electron-blocking layer (EBL) can be either p-doped or undoped.
Figure 14D:
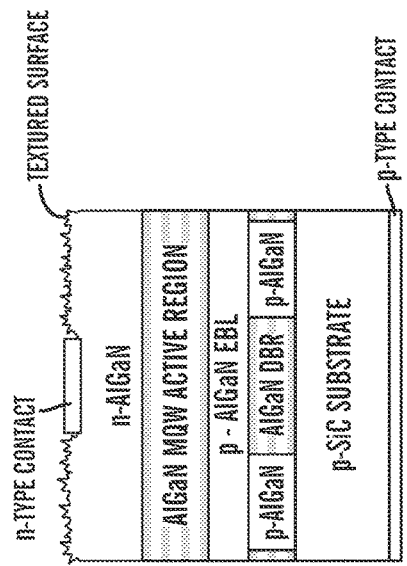
Figure 14A:
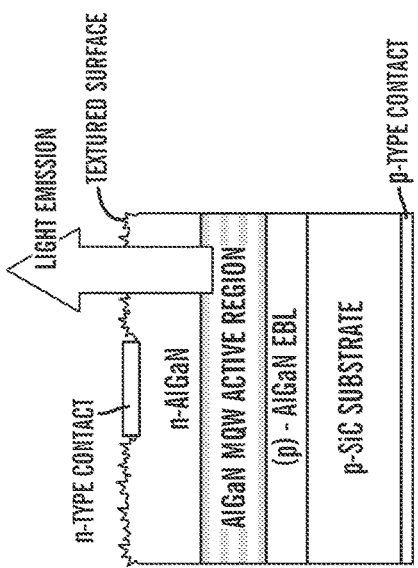
Figure 14C:
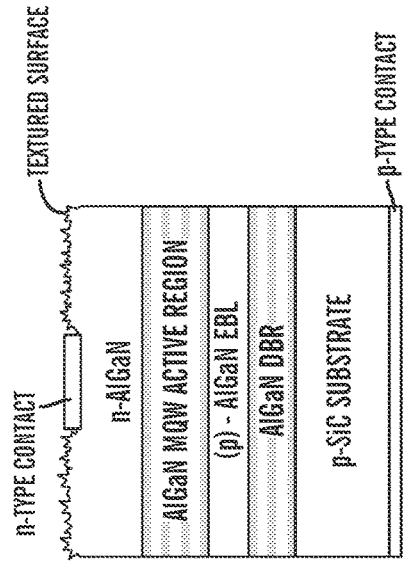

Embodiments of UV LEDs having p-SiC in the base layer can be seen, for example, in FIGS. 14A-14D, 15A-15B, and 17A-17B. The LED design is an inverted structure in which the p-SiC substrate is a base layer and an electrical component of the device, and holes can be injected from the p-SiC. As shown in FIG. 14A, the UV LED device according to some embodiments of the invention can include a doped p-SiC ($>10^{16}$ cm$^{-3}$) substrate, a p-type doped high AlN mole fraction AlGaN electron-blocking layer (AlN mole fraction higher than the lowest AlN mole fraction alloy present in the active region), a single or multiple AlGaN quantum wells as the active region, and an n-AlGaN layer. As shown in FIG. 14B, in some embodiments, a p-AlGaN film can be grown between the substrate and the active region. As shown in FIG. 14C, in some embodiments, a p-type polarization doped conductive AlGaN DBR can be included between the substrate and the electron-blocking layer. In some embodiments of the invention, the DBR is grown on top of a p-AlGaN template. As shown in FIG. 14D, in order to improve the hole injection from the p-SiC substrate, vias can be etched in the DBRs. The number of vias can be 1, 2, 3, 4, 5, 6, 7, 8, 9, 10, or more. Said vias can be filled with a conductive material forming conduction paths to the active region of the device. For example, conductive p-AlGaN can fill the vias during growth of the p-AlGaN EBL. Non-limiting examples of conductive materials used for filling the vias include p-AlGaN, p-GaN, or metals such as silver, titanium, nickel, aluminum. In the case of aluminum, there will be the additional benefit of reflecting UV light.

Figure 20A:
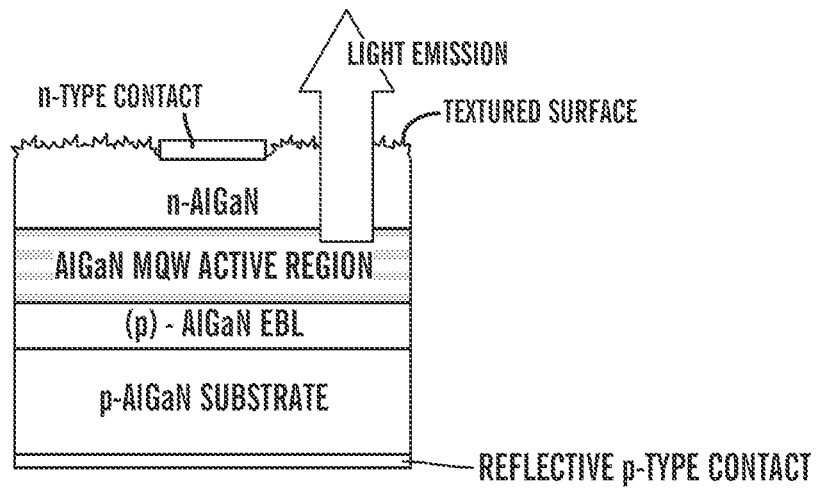
FIGS. 20A-20B are schematics of UV LEDs grown on p-AlGaN substrates. "(p)" means that the AlGaN electron-blocking layer (EBL) can be either p-doped or undoped.
Figure 20B:
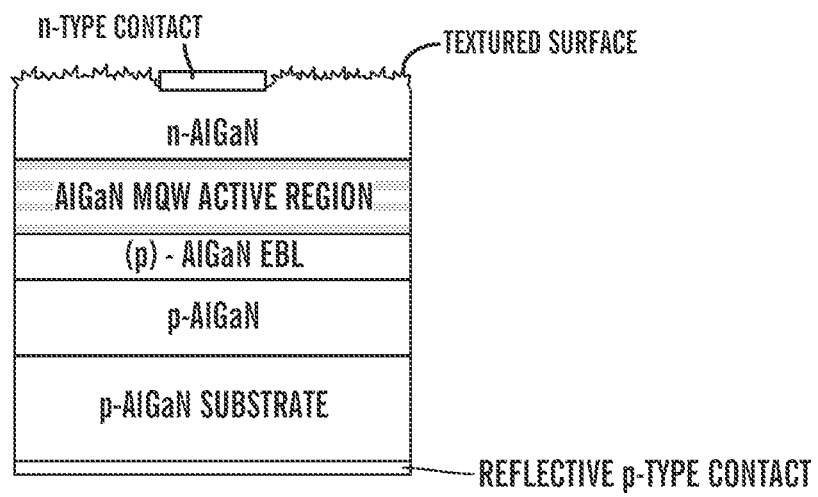

Embodiments of UV LEDs having p-type AlGaN in the base layer can be seen, for example, in FIGS. 20A-20B.

Figure 12B:
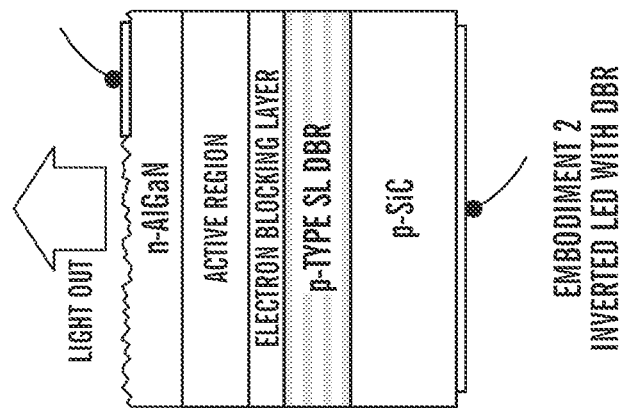
FIGS. 12A-12E are a set of schematics showing some embodiments where DBRs can be used.
Figure 12A:
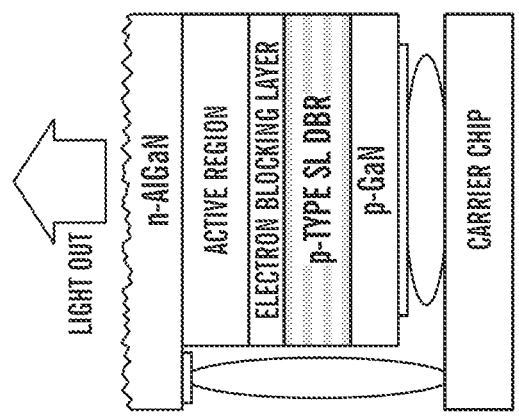
Figure 12C:
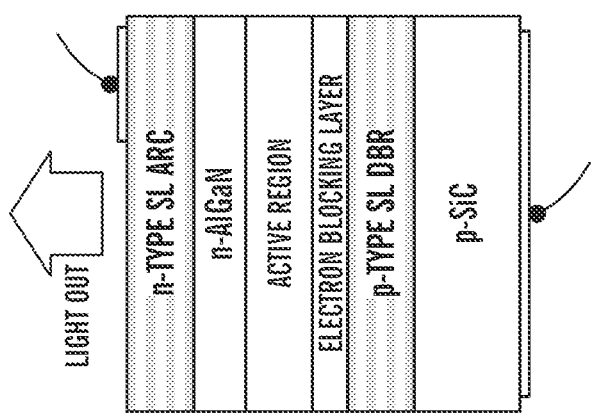
Figure 12D:
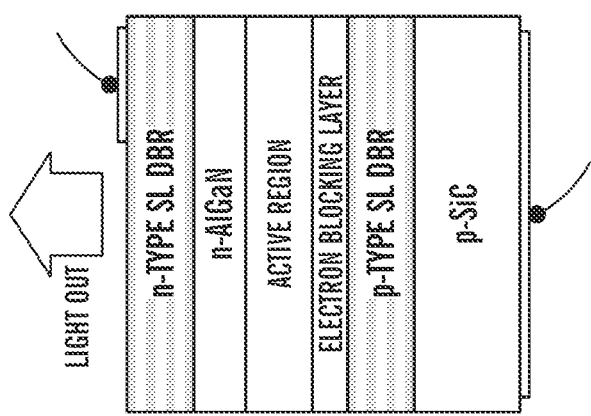
Figure 12E:
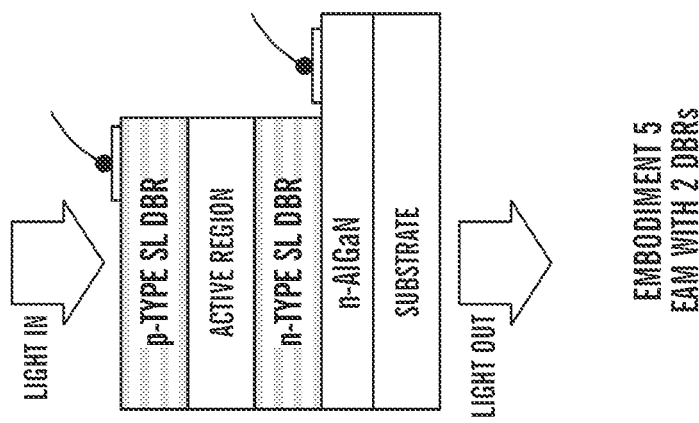
Figure 13:
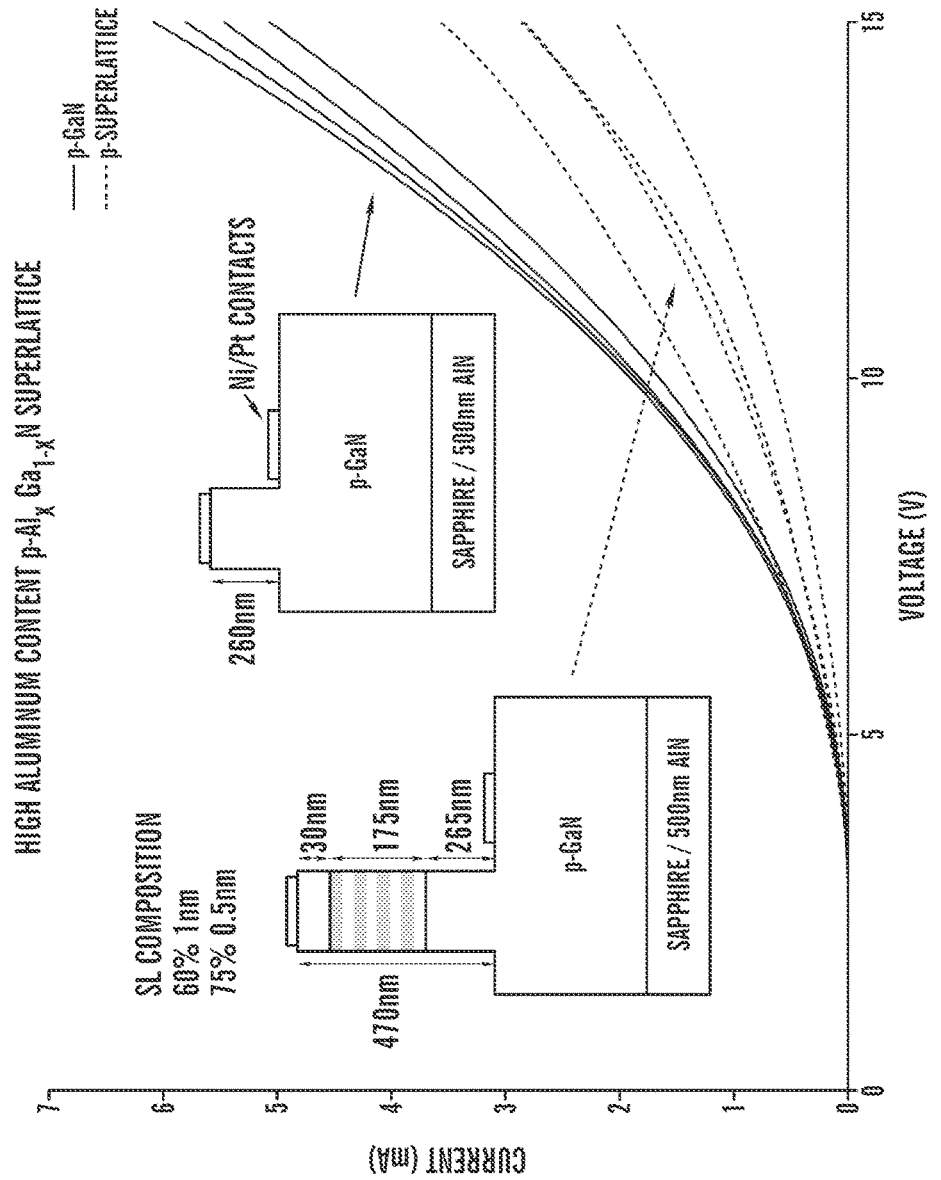
FIG. 13 shows current-voltage (IV) curves measured in the vertical direction through etched mesas of p-GaN and a high Al content short period superlattice inserted in a similarly grown p-GaN layer.

The design concept for the UV LEDs described herein can be applied in the construction of a UV laser. In accordance with some embodiments of the invention, a UV laser is also provided. In these embodiments, the UV laser can comprise a base layer comprising a p-type material (e.g., SiC or AlGaN), a p-type DBR, an active layer, an n-AlGaN layer, and an n-type DBR. The p-type DBR can be disposed between the base layer and the active layer, and the n-type DBR can be disposed between the n-type AlGaN layer and air. The pair of DBRs is adapted to function as mirrors that allow light originally generated in the active layer to bounce back and forth between the mirrors. The light passes through the active layer and gets amplified each time. In accordance with some embodiments of the invention, the UV laser can further comprise an electron-blocking layer disposed between the p-type DBR and the active layer. FIG. 12D is a schematic of a laser in accordance with some embodiments of the invention.

The design concept for the UV LEDs described herein can also be applied in the construction of an electro-absorption modulator (EAM). An EAM is a semiconductor device which, for example, can be used for modulating the intensity of a laser beam via an electric voltage. In accordance with some embodiments of the invention, an EAM is also provided. In these embodiments, the EAM can comprise an n-type AlGaN layer, an n-type DBR, an active layer, and a p-type DBR. The p-type DBR can form a first side of the EAM, and the n-type AlGaN layer can form a second side of the EAM. The EAM is adapted to receive an input light from the first side and produce an output light from the second side. The EAM can modulate the input light by applying an electric field in a direction perpendicular to the input light passing through the EAM. The active layer can be disposed between the p-type DBR and the n-type DBR. The n-type DBR can be disposed between the n-type AlGaN layer and the active layer. In accordance with some embodiments of the invention, the EAM can further comprise a substrate layer in contact with the n-type AlGaN layer. FIG.

12E is a schematic of an EAM in accordance with some embodiments of the invention.

Distributed Bragg Reflector (DBR)

The DBRs of the invention are designed to have at least one desired peak in reflectivity that matches the emission peak of the light generated in the active layer. Hence, the DBRs can have at least one desired peak in reflectivity in the range of 210-365 nm. The width of the peak can be controlled through the design of the DBR.

One aspect of the invention relates to an electrically conductive DBR comprising a plurality of alternating first layers and second layers having different refractive indices, wherein the first layer and the second layer each comprises a plurality of alternating layers having different spontaneous polarizations.

Yet another aspect of the invention relates to an electrically conductive DBR comprising a plurality of repeating layers, wherein each layer is graded in composition between at least two materials with different spontaneous polarizations.

Embodiments of the DBR can be n-type or p-type. In accordance with some embodiments of the invention, the DBR can substantially comprise AlGaN.

Accordingly, two basic types of novel conductive DBR structures are taught: one based on short period superlattices and one based on graded AlGaN compositions. As used herein, a "short period superlattice" is a plurality of periodically or semi-periodically repeating layers. Both DBR structures operate under the principle that AlGaN alloys of different AlN mole fraction have different indices of refraction and consequently optical films can be made using layers of different AlGaN composition.

Figure 10B:
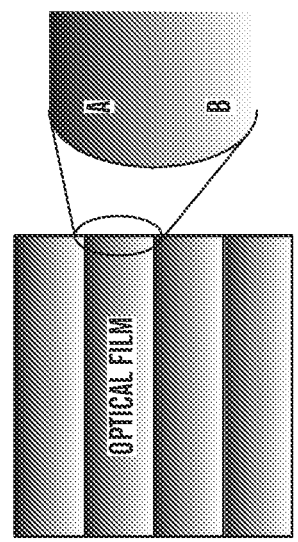
FIG. 10B is a schematic showing one embodiment of a distributed Bragg reflector (DBR). An optical film where the composition of material A and material B is graded. The difference in spontaneous polarization between A and B is spread out producing a three-dimensional carrier gas.
Figure 10A:
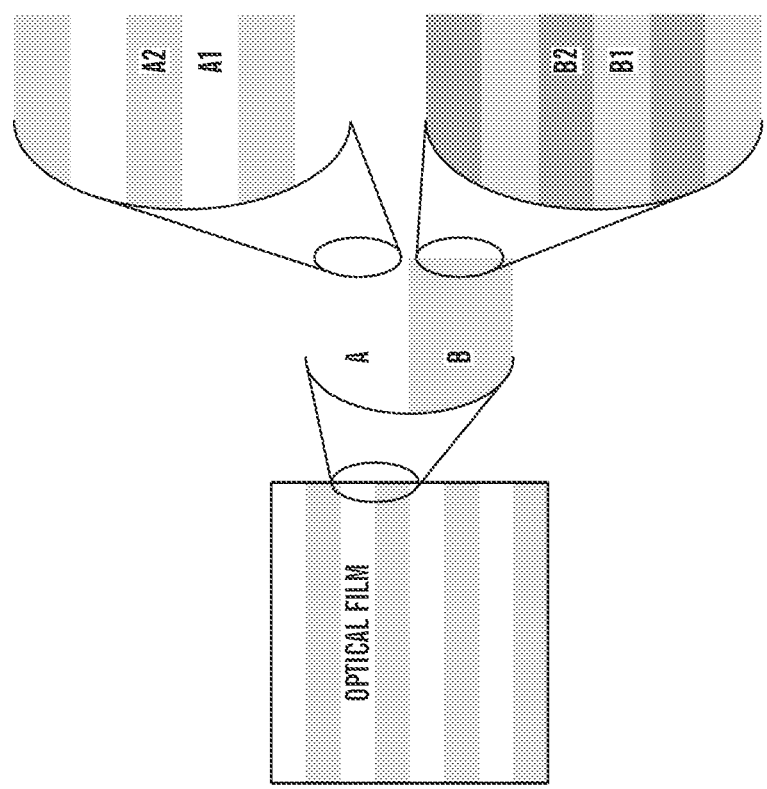
FIG. 10A is a schematic showing one embodiment of a distributed Bragg reflector (DBR). An optical film composed of alternating layers A and B with different effective indices of refraction. The thicknesses and indices of refraction of these layers establish the optical properties of the optical film. Layers A and B are then each composed of thinner alternating layers A1 and A2, and B1 and B2, respectively. These alternating thinner layers (e.g. A1 and A2) each have different spontaneous polarizations, leading to an advantageous redistribution of free carriers within the larger film (e.g. A).
Figure 11:
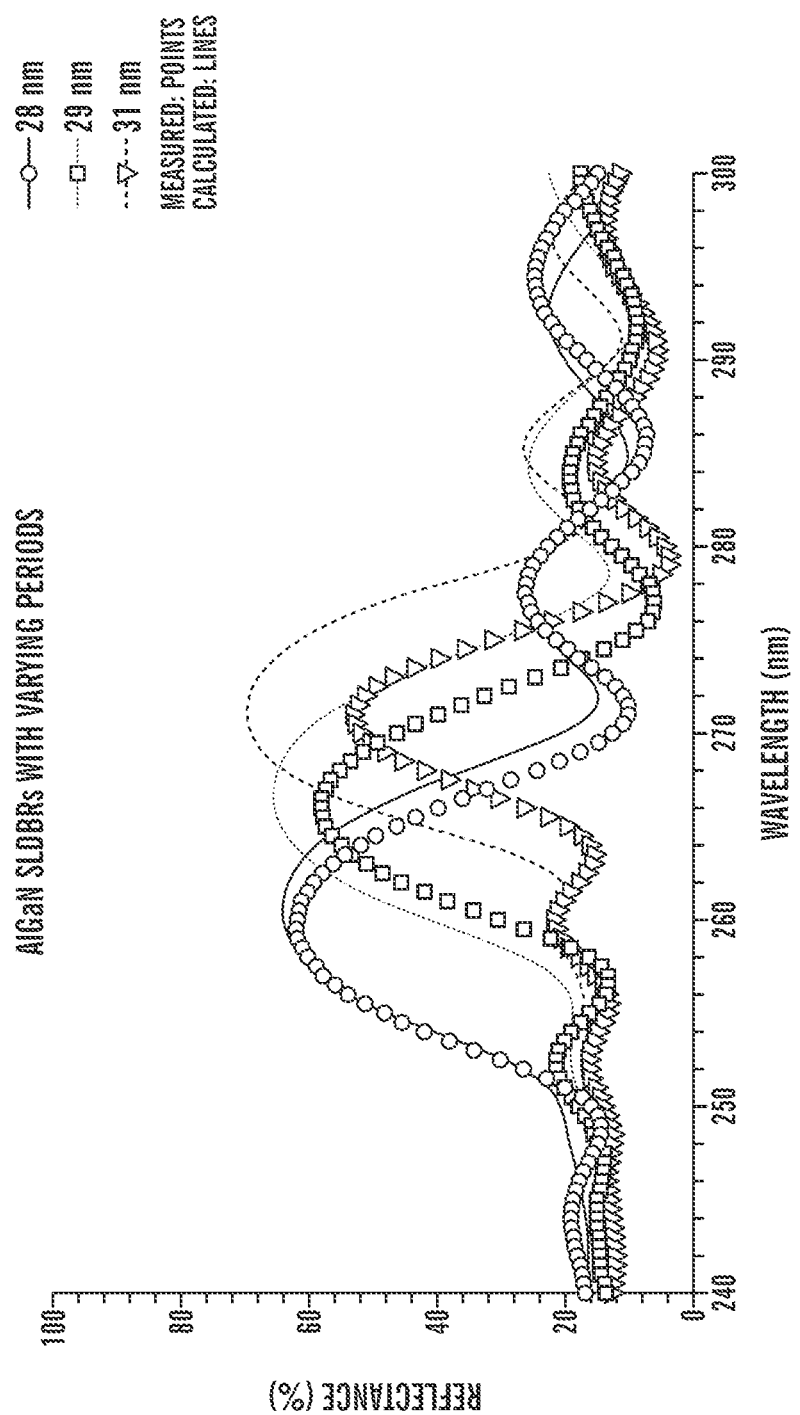
FIG. 11 shows measured (points) and simulated (lines) reflectance spectra for three p-type polarization doped SL DBRs with varying optical thicknesses. A series of DBRs with reflectance peaks around 265 nm were grown on top of a GaN buffer doped p-type with Mg. The first superlattice in these structures was 0.5 nm barriers of 95% p-AlGaN and 0.5 nm wells of 75% p-AlGaN. The second superlattice was 0.5 nm barriers of 75% p-AlGaN and 0.5 nm wells of 55% p-AlGaN. The number of layers within the superlattices was varied to change the optical scale periodicity and thus the position of the reflectance peak. The reflectance measurements were taken using a CARY 5000 spectraphotometer, at near normal incidence (8 degrees), with an Al mirror as a reference. All samples showed reflectivity values over 50% in the deep UV.

In accordance with some embodiments of the invention, a DBR structure can include a stack of periodically or semi-periodically repeating AlGaN layers with different average refractive indices, wherein one or more layers are short period superlattices (FIG. 10A). Layers composed of superlattices can have enhanced conductivity as compared to a bulk AlGaN film of the same average composition.

In accordance with some embodiments of the invention, a DBR structure can include periodically repeating layers A and B, where A is a superlattice with a different average index of refraction than B. The thicknesses of layers A and B can be selected to maximize reflectivity at the peak emission wavelength of the UV LED.

For DBRs comprising a plurality of alternating first layers and second layers, each having different average refractive indices, the peak reflectivity value depends on the difference of the index of refraction between the two DBR bilayers, and the total number of bilayers. The refractive index differences for these structures can be around the range of 0.5 to 0.05. The index of refraction for a desired wavelength can be tuned by adjusting the AlN mole fraction in the AlGaN alloy. As an example, a DBR on SiC made from superlattices of average AlN content 60% and 80%, contains an index of refraction contrast of 0.17 at 290 nm, and 0.23 at 270 nm. Correspondingly, to achieve reflectivity (here "reflectivity" is modeled as would be measured from air onto the DBR/SiC structure) peaks of at least 75% at 290 or 270 nm, 11 or 8 bilayers can be used respectively. This example assumes bilayer thicknesses tuned to achieve a reflectivity peak at the specified wavelength. In some device implementations, the DBRs can contain as many bilayers as possible to maximize reflectivity, so long as the Ohmic losses through the finite resistance of the DBRs don't become problematic for the desired electrical behavior. A DBR can comprise about 5-30 bilayers. The thickness of each layer can be determined based on alloy compositions used in the DBR and the desired peak wavelength. For example, the thickness of each bilayer can be from about 30 nm to 100 nm.

For DBRs comprising a plurality of alternating first layers and second layers, and in accordance with some embodiments of the invention, the first layer can comprise a plurality of alternating $Al_{0.60}Ga_{0.40}N$ layers and $Al_{0.75}Ga_{0.25}N$ layers, and the second layer can comprise a plurality of alternating $Al_{0.50}Ga_{0.50}N$ layers and $Al_{0.70}Ga_{0.30}N$ layers.

For DBRs comprising a plurality of alternating first layers and second layers, and in accordance with some embodiments of the invention, the first layer can comprise a plurality of alternating $Al_{0.55}Ga_{0.45}N$ layers and $Al_{0.75}Ga_{0.25}N$ layers, and wherein the second layer can comprise a plurality of alternating $Al_{0.75}Ga_{0.25}N$ layers and $Al_{0.95}Ga_{0.05}N$ layers.

In accordance with some embodiments of the invention, the DBR structure can include one or more compositionally graded AlGaN layers (FIG. 10B). The number of layers can be in the range of 3-50, e.g., 3-45, 3-40, 3-35, or 3-30. The DBR structure can include a plurality of periodically repeating layers, wherein at least one layer is graded in composition between at least two materials with different spontaneous polarizations. Without limiting the invention to a single mechanism, it is believed that the varying polarizations within the graded layers leads to space charge throughout the layer proportional to how much the polarization is varying in the space around any given point. In accordance with some embodiments of the invention, the layers with graded composition have enhanced conductivity as compared to a bulk AlGaN film of the same average composition.

Figure 18:
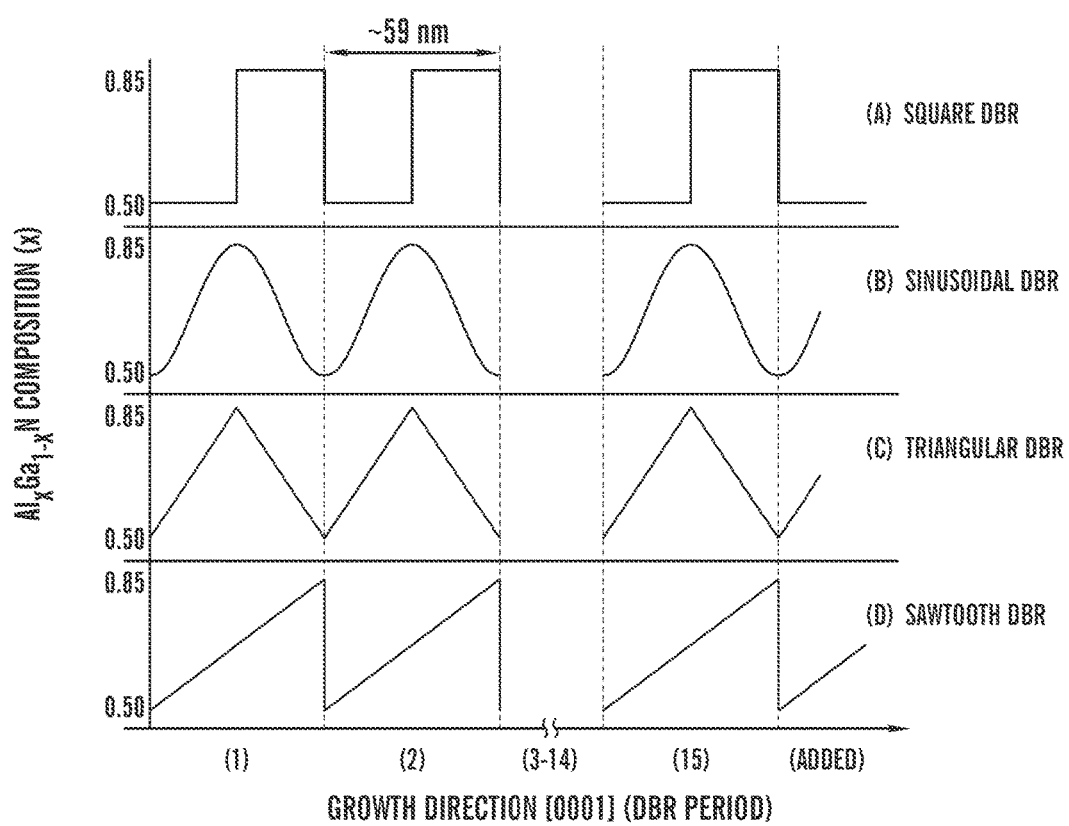
FIG. 18 shows the schematics of some embodiments of repeated compositionally graded layer DBRs.

In addition to varying spontaneous polarizations, the graded AlGaN composition films can have a varying index of refraction. Therefore, a repeated set of compositionally graded layers creates a periodic modulation in the index of refraction, and thus a 1D photonic bandgap. This provides tunable optical properties just as in a traditional DBR composed of 2 alternating bulk AlGaN films which is simply a particular case of a structure with a 1D photonic bandgap. In contrast to a traditional bulk film based DBR structure, the DBR structure with at least one layer containing a graded AlGaN composition described in this invention, may or may not necessarily have discontinuities in the AlGaN composition throughout its extent. In accordance with some embodiments of the invention, the lack of discontinuities in AlN mole fraction throughout the DBR (no heterointerfaces) can lead to improved material quality and/or higher conductivity than a DBR structure with the same average AlN mole fraction that does contain heterointerfaces. In accordance with some embodiments of the invention, the DBR structure can contain at least one layer with a sinusoidally varying AlGaN alloy composition. In accordance with some embodiments of the invention, the DBR structure can comprise a plurality of layers with continuously varying AlGaN compositions with periods equal to that of each layer's thickness, such that the composition varies continuously throughout the DBR. In accordance with some embodiments of the invention, at least one layer can have a monotonic change in the index of refraction along the direction perpendicular to the layers. In accordance with some embodiments of the invention, each layer can vary linearly from one AlGaN composition to another, such that there are discontinuities in the AlGaN composition between layers. AlGaN composition profiles for some embodiments of the invention are shown in FIG. 18.

For the DBRs based on compositionally graded layers, the reflection properties are a result of a nonzero Fourier coefficient describing the index of refraction variation along the direction perpendicular to the layers (and therefore the compositional profile, since the index of refraction typically depends on the AN content of the alloy). Therefore, the graded layer does not have to repeat exactly, so long as there is a non-negligible Fourier coefficient. As a non-limiting example, when the DBRs are designed as first-order gratings, it is the first order Fourier coefficient that must be non-zero. To achieve maximum reflectivity, the Fourier coefficient should be as large as possible which implies complete periodicity. However, an aperiodic structure can be designed to satisfy the Bragg condition at multiple wavelengths, which increases the reflectivity bandwidth at the cost of peak reflectivity strength. Either way, the DBR can be designed to have certain reflectivity properties which result from Fourier terms describing the variation of the index of refraction—for the most part this would mean periodic structures, but other designs can also be used. The desired peak wavelength depends on the thickness of each layer and the alloy content in the compositionally graded layers. For example, the thickness of each individual graded layer or the period of a continuously varying DBR or ARC can be from about 1 nm to 100 nm, e.g., 1 nm to 90 nm, 1 nm to 80 nm, 1 nm to 70 nm, 1 nm to 60 nm, 1 nm to 50 nm, or 10 nm to 50 nm.

For the DBRs based on compositionally graded layers, and in accordance with some embodiments of the invention, each layer can comprise a composition graded from $Al_{0.55}Ga_{0.45}N$ to $Al_{0.95}Ga_{0.05}N$.

For a DBR comprising AlGaN, the choice of the AlGaN alloy depends on optical considerations and conductivity considerations.

With regard to optical considerations, maximum optical reflectance can be achieved by maximizing the index of refraction contrast within the DBR. The index of refraction decreases as the aluminum content in AlGaN is increased, so the largest index contrast can be accomplished by choosing AlGaN alloys with large differences in aluminum content. The extreme case would be choosing GaN (index ~2.6) and AN (index ~2.1) as constituents of the film. The index of refraction is wavelength dependent (chromatic dispersion) and should be considered at the wavelength(s) of interest. On the other hand, optical absorption should be minimized at the wavelength(s) of interest, so the extinction coefficient of the alloys used is generally considered. The extinction coefficient significantly increases as photon energy approaches the band-gap, so a design rule could be to choose AlGaN alloys with band-gaps larger than the wavelength(s) of interest. Since band-gap increases with aluminum content in AlGaN alloys, choosing alloys with higher aluminum content than the active region is advisable. The extreme application of this design rule would be the use of solely AlN, however a single material would not constitute a DBR, so in practice an AlGaN alloy with some gallium content would be selected for at least one of the films. A non-limiting example based on the above optical considerations can be an LED where the active region is composed of $Al_{0.4}Ga_{0.6}N$ and the DBR is composed of two alternating films of $Al_{0.6}Ga_{0.4}N$ and AlN. Both of the alloys in the DBR have higher aluminum content than the active region, so their band gaps are wider than that of the active region, reducing absorption in the DBR. Further, to maximize the index of refraction contrast, a large difference in aluminum content is selected for the two films in the DBR.

With regard to conductivity considerations, the ionization energy of the typical p-type (e.g., Mg) and n-type (e.g., Si) dopants increase greatly with the aluminum content of AlGaN alloys. This is particularly true of Mg. With this in mind, the DBRs can consist of AlGaN alloys with the minimum amount of aluminum. The extreme application of this design rule would be to use solely GaN, however a single material would not constitute a DBR, so in practice an AlGaN alloy with some aluminum content can be selected for at least one of the films. The desire to use low aluminum AlGaN alloys is in direct opposition to the design criteria for minimizing optical absorption. An appropriate compromise between the two design principles can be used for the particular emission wavelength of the LED.

However, choosing a low aluminum AlGaN alloy to reduce the ionization energy neglects polarization enhanced ionization which can be used to provide sufficient free carriers even at very high aluminum compositions, significantly reducing the importance of the dopant ionization energy in the absence of a polarization field. In some embodiments, the strength of the polarization field induced in the material contributes to the free carrier concentration more than the thermal ionization of dopants. To generally maximize conductivity, the number of free carriers and the mobility are both simultaneously maximized. The spontaneous polarization in AlGaN alloys varies as a function of aluminum content so any heterointerface will result in a discontinuity in polarization and lead to a fixed sheet charge that will draw the opposite free charge carriers. To maximize the size of this discontinuity, the largest difference in polarization is desired, leading to the largest difference in aluminum content between alloys used in the DBR. The extreme case of this would be the use of GaN and AlN as two materials in the DBR. This polarization field need not be abrupt as is the case in a heterointerface, but can be spatially distributed as in the case of a graded AlGaN composition film. This design goal is synergistic with that of providing the largest index of refraction contrast. Without polarization enhanced doping, the use of low aluminum content to allow for thermal ionization of dopants (e.g., Mg) would be at odds with the need for high aluminum content to prevent absorption in the DBR.

In some embodiments, the conductivity is due to and/or enhanced by the presence of polarization fields. In some embodiments, a narrow gap quantum well based on InGaN can be included in the DBR structure to promote tunneling to enhance vertical conductivity. A non-limiting example is a sinusoidally varying DBR with an InGaN quantum well placed at the highest AN mole fraction position in each period.

Either of the DBR or ARC structures taught herein can be designed for peak reflectance (or transmittance in the case of an ARC) to match the emission spectrum of UV LEDs in the 210 to 365 nm region. Two non-limiting examples are shown as follows. For a superlattice-based DBR, two AlGaN superlattices A and B can be chosen such that the average index of refractions are different for each, and the thicknesses for A and B can be chosen such that the optical thicknesses of A and B (using the average index of refraction for A and B respectively) are one quarter of the target wavelength. For a graded composition DBR, a sinusoidal composition profile can be chosen with the AlGaN composition varying between A and B, where A and B are chosen to provide adequate index of refraction contrast, with a period equal to the thickness of a bulk film—with index of refraction equal to the average of A and B—whose optical thickness is half the target wavelength. As with traditional DBRs composed of bulk films, either type of the DBR structures described herein can have the maximum reflectivity tuned as well. A non-limiting example is given as follows. If the refractive index contrast is small, more layers can be used to achieve larger reflection. Conversely, if the refractive index contrast is large, fewer layers need to be used to achieve the same reflectivity. A practitioner skilled in the art can design the DBR and ARC structures described in this invention to optically replace a given traditional DBR structure. The additional utility in these DBR or ARC structures is the electrical conductivity afforded by the structures.

The UV LEDs of the invention can be used in a number of applications such as UV photolithography, water/air purification, surface disinfection, free-space non-line-of-sight communication, epoxy curing, counterfeit detection and fluorescence identification of biological/chemical agents.

Methods of Manufacture

The UV LEDs described herein can be fabricated using standard methods known in the art. For example, the different layers can be grown by methods such as molecular beam epitaxy (MBE), metalorganic chemical vapor deposition (MOCVD), sputtering, e-beam deposition, chemical vapor deposition, physical vapor deposition, atomic layer deposition, and combinations thereof.

Metal contacts can be deposited by electron beam evaporation, thermal evaporation, or sputtering, and subsequent thermal annealing of the deposited metal films can be performed to achieve Ohmic contacts. An ohmic contact is a non-rectifying junction: an electrical junction between two conductors that has a linear current—voltage (I-V) curve as with Ohm's law. The design of the n-AlGaN contact geometry can be determined by the current spreading characteristics of the device. In accordance with some embodiments of the invention, if the n-AlGaN has low sheet resistance (high degree of current spreading), a smaller contact can be used. In accordance with some embodiments of the invention, the contact geometry can include small pads, rings, or crosses. As the n-AlGaN sheet resistance increases (with more resistive or thinner n-AlGaN), the contact geometry can generally account for suppressed current spreading. In accordance with some embodiments of the invention, the contact geometry can include a micro-window array design.

In accordance with some embodiments of the invention, the active region of the UV LED structure can be grown using the liquid phase epitaxy growth mode in order to promote band structure potential fluctuations as well as to prevent incorporation of oxygen impurities.

The following are non-limiting methods of n-AlGaN surface texturing and are included in some embodiments of the invention. First, a pattern is defined through standard photolithography or electron beam lithography processes. Specific examples include the definition of a photoresist mask through standard photolithography processes, on top of the n-AlGaN layer, or the definition of an electron beam resist (such as but not limited to, PMMA) mask by direct electron-beam writing on top of the n-AlGaN layer. This pattern can be used as, or to create, an etch mask. The n-AlGaN can then be etched with standard chlorine-based plasma etching techniques. An alternative approach involves randomly roughening the n-AlGaN rather than patterning it. A method to achieve this involves first evaporating a thin (<5 nm) layer of metal onto the n-AlGaN, then annealing the sample to form a metal cluster mask. Once the metal cluster mask is defined, the same standard chlorine-based plasma etching techniques can be used to etch and roughen the surface, followed by removal of the mask. Another technique is depositing an etch mask (such as but not limited to, polystyrene spheres) using the Langmuir-Blodgett technique. Plasma etching through the spheres patterns the surface. Nano imprint lithography can be used to define a two-dimensional photonic crystal pattern on top of the n-AlGaN layer. This pattern can then be used to create an etch mask. Surface patterning can be achieved by plasma etching or reactive ion etching through the etch mask. An arbitrary surface pattern can be directly written on the n-AlGaN layer through focused-ion-beam milling.

In accordance with some embodiments of the invention, the UV LED does not need to be flip-chip bonded for thermal management, thus reducing cost.

It should be understood that this invention is not limited to the particular methodology, protocols, and reagents, etc., disclosed herein and as such may vary. The terminology used herein is for the purpose of describing particular embodiments only, and is not intended to limit the scope of the present invention, which is defined solely by the claims.

As used herein and in the claims, the singular forms include the plural reference and vice versa unless the context clearly indicates otherwise. Other than in the operating examples, or where otherwise indicated, all numbers expressing quantities of ingredients or reaction conditions used herein should be understood as modified in all instances by the term "about."

Although any known methods, devices, and materials may be used in the practice or testing of the invention, the methods, devices, and materials in this regard are disclosed herein.

Some embodiments of the invention are listed in the following numbered paragraphs:

1. A deep ultraviolet light-emitting diode comprising:
a base layer including a p-type material forming a first side of the diode;
an active layer grown on the base layer, whereby radiative recombination of carriers in the active layer can produce ultraviolet light; and
an n-AlGaN layer grown on the active layer, wherein the n-AlGaN is on a second side of the diode which is opposite to the first side, and wherein the active layer is disposed between the base layer and the n-AlGaN layer.

2. The ultraviolet light-emitting diode of paragraph 1, wherein the p-type material is SiC or AlGaN.

3. The ultraviolet light-emitting diode of paragraph 1, further comprising a light-reflecting layer comprising at least one p-type electrically conductive AlGaN distributed Bragg reflector (DBR), wherein the light-reflecting layer is disposed between the base layer and the active layer, and whereby the p-type DBR effectively reflects the ultraviolet light away from the base layer.

4. The ultraviolet light-emitting diode of paragraph 3, wherein the p-type DBR has a peak reflectance substantially similar to the wavelength of the ultraviolet light produced by the active layer.

5. The ultraviolet light-emitting diode of paragraph 3, wherein the p-type DBR comprises a plurality of alternating first layers and second layers having different refractive indices, wherein the first layer and the second layer each comprises a plurality of alternating layers having different spontaneous polarizations.

6. The ultraviolet light-emitting diode of paragraph 3, wherein the p-type DBR comprises a plurality of repeating layers, wherein each layer is graded in composition between at least two materials with different spontaneous polarizations.

7. The ultraviolet light-emitting diode of paragraph 1, further comprising an electron-blocking layer disposed between the light-reflecting layer and the active layer.

8. The ultraviolet light-emitting diode of paragraph 7, wherein the electron blocking layer is p-doped or undoped.

9. The ultraviolet light-emitting diode of paragraph 1, wherein the active layer substantially comprises AlGaN, InAlN, or InAlGaN.

10. The ultraviolet light-emitting diode of paragraph 1, wherein the active layer comprises a single quantum well.

11. The ultraviolet light-emitting diode of paragraph 1, wherein the active layer comprises a plurality of quantum wells.

12. The ultraviolet light-emitting diode of paragraph 1, wherein the active layer comprises a plurality of quantum dots.

13. The ultraviolet light-emitting diode of paragraph 1, wherein the n-AlGaN layer comprises a textured surface, whereby light is emitted from the textured surface.

14. The ultraviolet light-emitting diode of paragraph 13, wherein the textured surface has a random texture.

15. The ultraviolet light-emitting diode of paragraph 13, wherein the textured surface has a patterned texture.

16. The ultraviolet light-emitting diode of paragraph 15, wherein the patterned texture comprises a micro lens array.

17. The ultraviolet light-emitting diode of paragraph 15, wherein the patterned texture comprises a photonic crystal.

18. The ultraviolet light-emitting diode of paragraph 1, further comprising an n-type electrically conductive anti-reflective coating layer in contact with the n-AlGaN layer, such that the n-AlGaN layer is disposed in between the active layer and the anti-reflective coating layer.

19. The ultraviolet light-emitting diode of paragraph 1, wherein the diode can produce light in the range of 210 nm to 365 nm.

20. The ultraviolet light-emitting diode of paragraph 1, wherein the diode can produce light in the range of 250 nm to 300 nm.

21. An electrically conductive distributed Bragg reflector (DBR) comprising a plurality of alternating first layers and second layers having different refractive indices, wherein the first layer and the second layer each comprises a plurality of alternating layers having different spontaneous polarizations.

22. The electrically conductive DBR of paragraph 21, wherein the DBR is p-type or n-type.

23. The electrically conductive DBR of paragraph 22, comprising 3-50 alternating first layers and second layers.

24. The electrically conductive DBR of paragraph 22, wherein the first layer and the second layer each comprises 2-150 alternating layers.

25. The electrically conductive DBR of paragraph 22, wherein the DBR substantially comprises AlGaN.

26. The electrically conductive DBR of paragraph 25, wherein the first layer comprises a plurality of alternating $Al_{0.60}Ga_{0.40}N$ layers and $Al_{0.75}Ga_{0.25}N$ layers, and wherein the second layer comprises a plurality of alternating $Al_{0.50}Ga_{0.50}N$ layers and $Al_{0.70}Ga_{0.30}N$ layers.

27. The electrically conductive DBR of paragraph 25, wherein the first layer comprises a plurality of alternating $Al_{0.55}Ga_{0.45}N$ layers and $Al_{0.75}Ga_{0.25}N$ layers, and wherein the second layer comprises a plurality of alternating $Al_{0.75}Ga_{0.25}N$ layers and $Al_{0.95}Ga_{0.05}N$ layers.

28. An electrically conductive distributed Bragg reflector (DBR) comprising a plurality of repeating layers, wherein each layer is graded in composition between at least two materials with different spontaneous polarizations.

29. The electrically conductive DBR of paragraph 28, wherein the DBR is p-type or n-type.

30. The electrically conductive DBR of paragraph 29, comprising 3-50 repeating layers.

31. The electrically conductive DBR of paragraph 29, wherein the DBR substantially comprises AlGaN.

32. The electrically conductive DBR of paragraph 31, wherein each layer comprises a graded composition from $Al0.55Ga0.45N$ to $Al0.95Ga0.05N$.

33. The electrically conductive DBR of paragraph 28, further comprising an InGaN quantum well positioned at the highest AlN mole fraction in each layer.

Definitions

Unless stated otherwise, or implicit from context, the following terms and phrases include the meanings provided below. Unless explicitly stated otherwise, or apparent from context, the terms and phrases below do not exclude the meaning that the term or phrase has acquired in the art to which it pertains. The definitions are provided to aid in describing particular embodiments, and are not intended to limit the claimed invention, because the scope of the invention is limited only by the claims. Further, unless otherwise required by context, singular terms shall include pluralities and plural terms shall include the singular.

As used herein, the term "comprising" or "comprises" is used in reference to compositions, methods, and respective component(s) thereof, that are useful to an embodiment, yet open to the inclusion of unspecified elements, whether useful or not.

As used herein, the term "consisting essentially of" refers to those elements required for a given embodiment. The term permits the presence of elements that do not materially affect the basic and novel or functional characteristic(s) of that embodiment of the invention.

As used herein, the term "AlGaN" refers to doped or undoped $Al_xGa_{1-x}N$, where x is from 0 to 1. In some embodiments, x is from 0 to 0.95. In some embodiments, x is from 0.05 to 1. In some embodiments, x is from 0.05 to 0.95. Non-limiting examples of x include 0, 0.05, 0.1, 0.15, 0.2, 0.25, 0.3, 0.35, 0.4, 0.45, 0.5, 0.55, 0.6, 0.65, 0.7, 0.75, 0.8, 0.85, 0.9, 0.95, and 1. Thus the term "AlGaN" also encompasses AlN and GaN.

As used herein, the terms "n-type AlGaN" and "n-AlGaN" are used interchangeably to refer to an AlGaN composition doped by at least one n-type dopant. The electrical conductivity of a n-AlGaN substrate can be adjusted by changing the concentration of the n-type dopant.

As used herein, the terms "p-type AlGaN" and "p-AlGaN" are used interchangeably to refer to an AlGaN composition doped by at least one p-type dopant. The electrical conductivity of a p-AlGaN substrate can be adjusted by changing the concentration of the p-type dopant.

As used herein, the terms "p-SiC" or "p-type SiC" are used interchangeably to refer to a silicon carbide composition doped by at least one p-type dopant. The electrical conductivity of a p-SiC substrate can be adjusted by changing the concentration of the p-type dopant. The term "p-SiC substrate" as used herein encompasses any p-SiC substrate, including a monocrystalline p-SiC substrate, a bicrystalline p-SiC substrate, a polycrystalline p-SiC substrate, a substrate comprising p-SiC nanoparticles and/or microparticles, an amorphous p-SiC substrate, or a quasi-substrate including, but not limited to, p-SiC templates grown on n-type or semi-insulating SiC substrates, p-AlGaN templates grown on p-SiC or semi-insulating SiC substrates. Some p-SiC substrates are commercially available through vendors such as Cree, University Wafer, and Norstel AB.

As used herein, the terms "SL" and "superlattice" are used interchangeably.

The singular terms "a," "an," and "the" include plural referents unless context clearly indicates otherwise. Similarly, the word "or" is intended to include "and" unless the context clearly indicates otherwise.

Other than in the operating examples, or where otherwise indicated, all numbers expressing quantities of ingredients or reaction conditions used herein should be understood as modified in all instances by the term "about." The term "about" when used in connection with percentages may mean±1% of the value being referred to. For example, about 100 means from 99 to 101.

Although methods and materials similar or equivalent to those disclosed herein can be used in the practice or testing of this disclosure, suitable methods and materials are described below. The term "comprises" means "includes." The abbreviation, "e.g." is derived from the Latin exempli gratia, and is used herein to indicate a non-limiting example. Thus, the abbreviation "e.g." is synonymous with the term "for example."

Although preferred embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow. Further, to the extent not already indicated, it will be understood by those of ordinary skill in the art that any one of the various embodiments herein described and illustrated can be further modified to incorporate features shown in any of the other embodiments disclosed herein.

All patents and other publications; including literature references, issued patents, published patent applications, and co-pending patent applications; cited throughout this application are expressly incorporated herein by reference for the purpose of describing and disclosing, for example, the methodologies described in such publications that might be used in connection with the technology disclosed herein. These publications are provided solely for their disclosure prior to the filing date of the present application. Nothing in this regard should be construed as an admission that the inventors are not entitled to antedate such disclosure by virtue of prior invention or for any other reason. All statements as to the date or representation as to the contents of these documents is based on the information available to the applicants and does not constitute any admission as to the correctness of the dates or contents of these documents.

The description of embodiments of the disclosure is not intended to be exhaustive or to limit the disclosure to the precise form disclosed. While specific embodiments of, and examples for, the disclosure are disclosed herein for illustrative purposes, various equivalent modifications are possible within the scope of the disclosure, as those skilled in the relevant art will recognize. For example, while method steps or functions are presented in a given order, alternative embodiments may perform functions in a different order, or functions may be performed substantially concurrently. The teachings of the disclosure provided herein can be applied to other procedures or methods as appropriate. The various embodiments disclosed herein can be combined to provide further embodiments. Aspects of the disclosure can be modified, if necessary, to employ the compositions, functions and concepts of the above references and application to provide yet further embodiments of the disclosure.

Specific elements of any of the foregoing embodiments can be combined or substituted for elements in other embodiments. Furthermore, while advantages associated with certain embodiments of the disclosure have been described in the context of these embodiments, other embodiments may also exhibit such advantages, and not all embodiments need necessarily exhibit such advantages to fall within the scope of the disclosure.

EXAMPLES

The following examples illustrate some embodiments and aspects of the invention. It will be apparent to those skilled in the relevant art that various modifications, additions, substitutions, and the like can be performed without altering the spirit or scope of the invention, and such modifications and variations are encompassed within the scope of the invention as defined in the claims which follow. The technology disclosed herein is further illustrated by the following examples which in no way should be construed as being further limiting.

Example 1

Figure 15A:
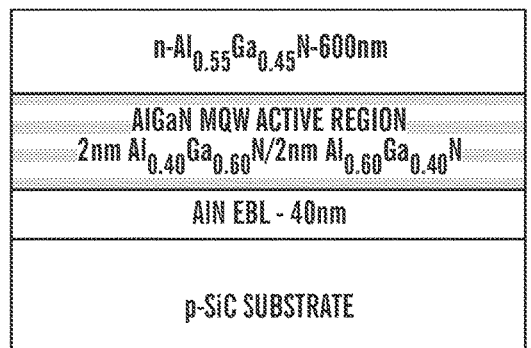
FIG. 15A is a schematic of a UV LED on p-SiC according to an embodiment of the invention.
Figure 15B:
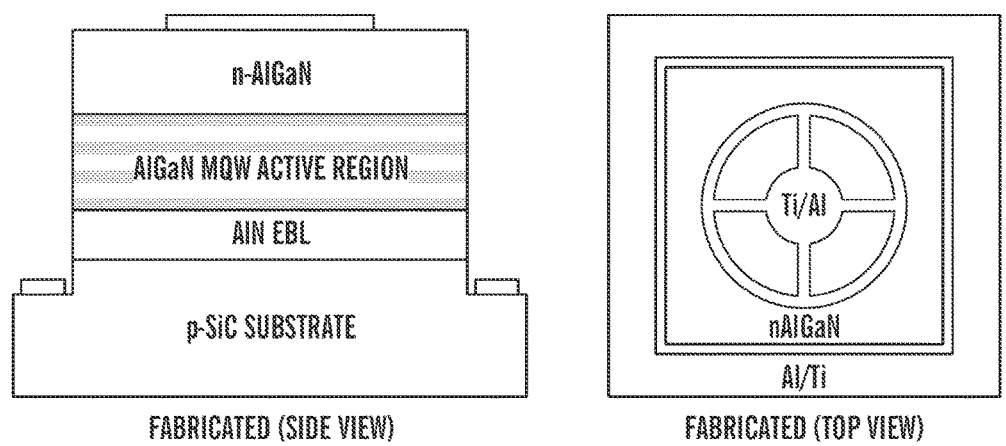
FIG. 15B shows a schematic of the fabricated device.

As a non-limiting example, an LED as described above can be grown on a p-SiC substrate as shown schematically in FIGS. 15A-15B. For said example, a Veeco GEN-II plasma assisted MBE system was used to grow the full device. The substrate was cleaned in situ by sequential cycles of Ga accumulation and evaporation. An undoped 40 nm thick AlN electron-blocking layer was grown using In as a surfactant. The active region consisted of 15 quantum wells 2 nm thick of 40% AlN mole fraction AlGaN alloy. Barriers for the wells consisted of 2 nm of 60% AlN mole fraction AlGaN alloy. The growth of the active region commenced with a barrier being grown against the electron blocking layer and terminated with a final barrier (bringing the active region to a total of 15.5 bilayers). The device growth was completed with 600 nm of 55% AlN mole fraction n-AlGaN.

In said example, mesas are used to define individual devices. Mesas can be defined by, for example, chlorine based reactive ion etching. In some embodiments of the invention, surface passivation steps (through plasma-enhanced SiN chemical vapor phase deposition for example) could be included to suppress surface recombination leakage current on mesa sidewalls. In accordance with some embodiments of the invention, mesa formation is not needed.

In said example, metal contacts can be deposited by electron beam evaporation, thermal evaporation, or sputtering, and subsequent thermal annealing of the deposited metal films can be performed to achieve Ohmic contacts.

In said example, 130 nm of Al followed by 30 nm of Ti were sequentially deposited by electron beam evaporation on the p-SiC substrate through a mask of photoresist. After lift-off, the metal remaining on the p-SiC was annealed to 1000° C. for 90 s in a Nitrogen and Argon atmosphere. This process resulted in Ohmic contacts to the p-SiC substrate. Other metal contact schemes and annealing processes can also be used.

In said example, 30 nm of Ti followed by 70 nm of Al were sequentially deposited by electron beam evaporation on the n-AlGaN through a mask of photoresist. After lift-off, the metal remaining on the n-AlGaN was annealed to 950 C for 120 s in a Nitrogen and Argon atmosphere. This process resulted in Ohmic contacts to the n-AlGaN layer. Other metal contact schemes and annealing processes can also be used, including but not limited to vanadium-based contacts [73].

Figure 15C:
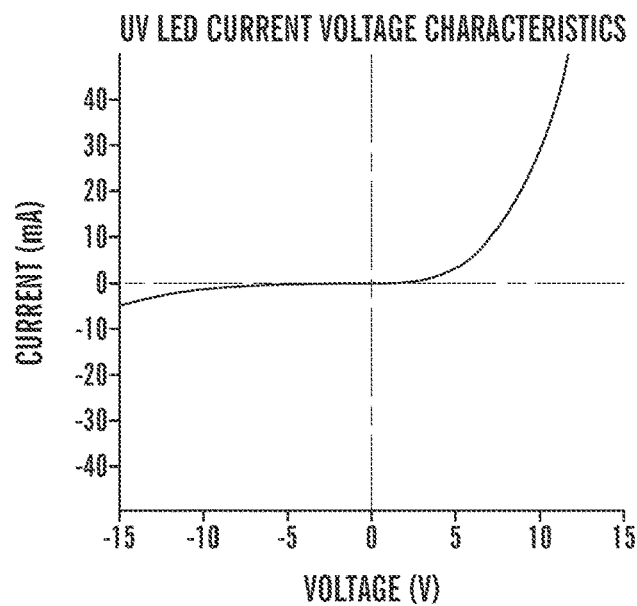
FIG. 15C shows the measured current-voltage characteristics.
Figure 15D:
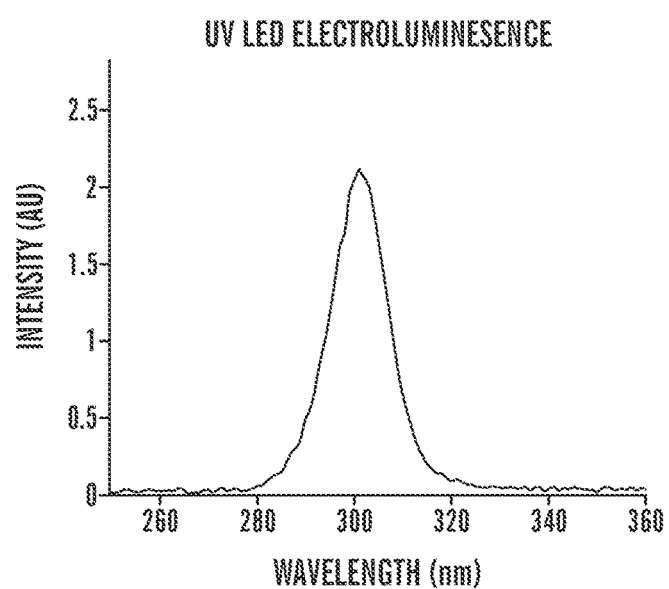
FIG. 15D shows the measured electroluminescence spectrum from this device.

The design of the n-AlGaN contact geometry for said example was determined by the current spreading characteristics of the device. For said example, the current voltage characteristic is shown in FIG. 15C. The device clearly shows good rectifying behavior with a turn on voltage below 5 volts. The UV electroluminescence spectrum is shown in FIG. 15D. The spectrum is symmetric with a peak centered at about 300 nm, consistent with the composition of the AlGaN quantum wells. This indicates that holes from the p-SiC substrate and electrons from the n-AlGaN are injected into the AlGaN MQW active region, whereupon they recombine radiatively.

Figure 16A:
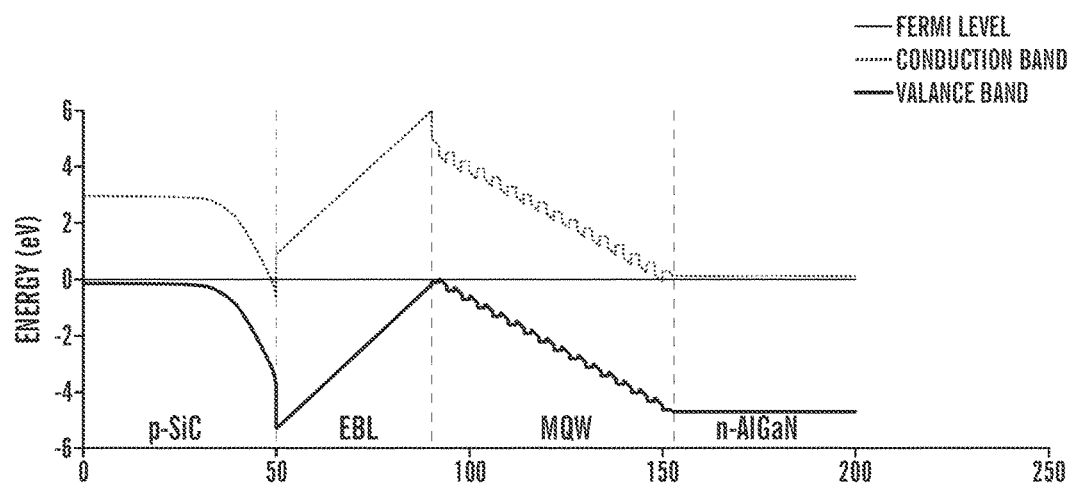
FIGS. 16A-16D show the simulated (using NextNano) equilibrium band structure of the deep UV LED design according to some embodiments of the invention.

In said example, the undoped AlN electron blocking layer was grown directly on the p-SiC substrate. As a semiconductor with a wide bandgap and a high activation energy for typical n- and p-type dopants, high AlN mole fraction AlGaN (eg. >70% AlN mole fraction) is typically considered highly insulating. However, in this embodiment, hole transport has been shown. It is understood that hole transport is aided by the polarization induced electric field in the electron blocking layer. This is supported by the equilibrium band diagram, shown in FIG. 16A, computed using Next-Nano, a semiconductor simulation package developed at the Walter Schottky Institute (Munich, Germany). The electric field present in the AlN electron blocking layer in FIG. 16A is further enhanced upon forward biasing and pushes holes towards the active region of the device.

Example 2

Figure 16B:
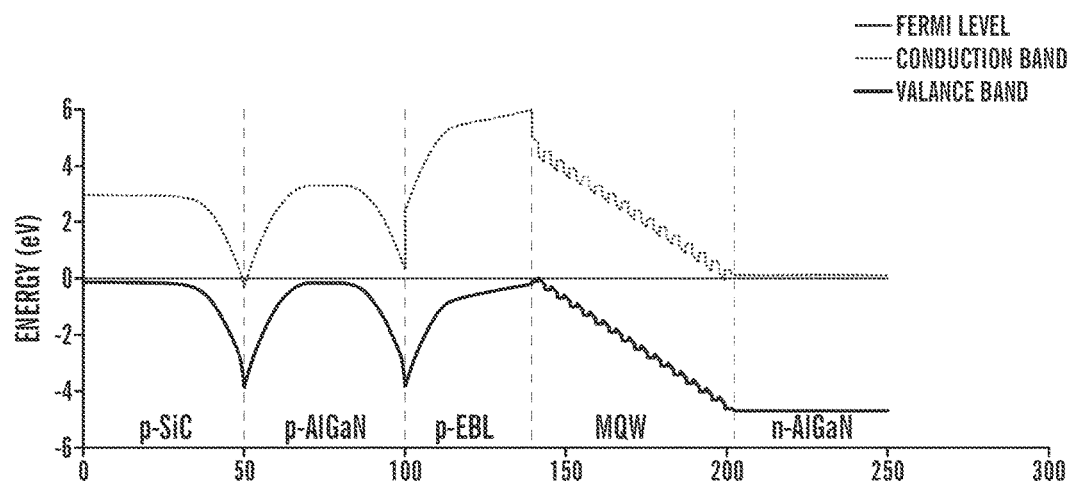
Figure 17A:
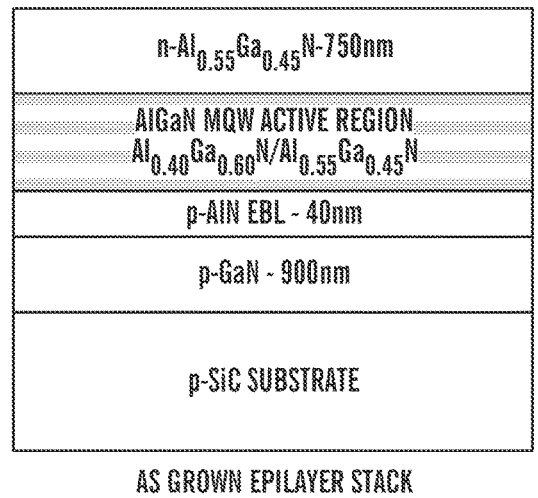
FIG. 17A is a schematic of a UV LED on p-SiC according to an embodiment of the invention.
Figure 17B:
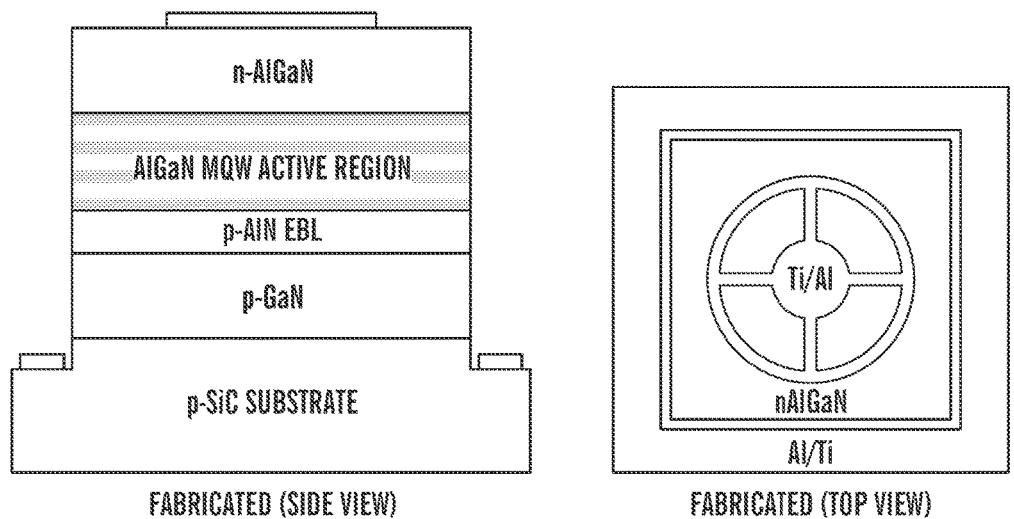
FIG. 17B shows a schematic of the fabricated device.
Figure 17C:
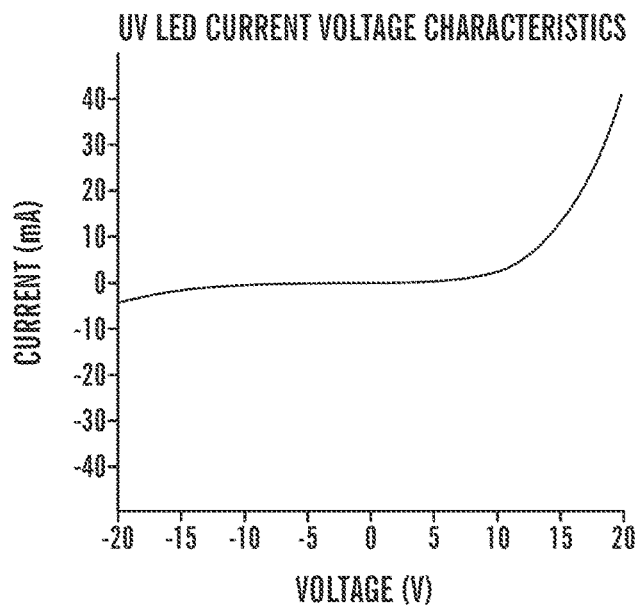
FIG. 17C shows the measured current-voltage characteristics.
Figure 17D:
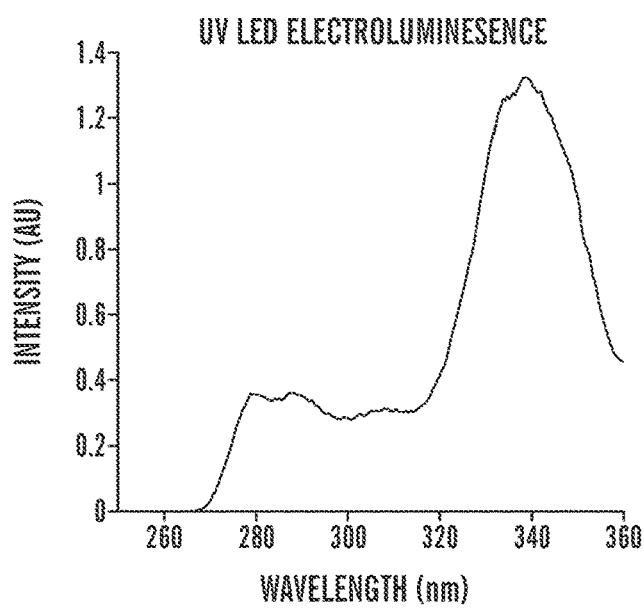
FIG. 17D shows the measured electroluminescence spectrum from this device.

As a non-limiting example, a UV LED including a p-doped AlGaN film between p-SiC and p-AlN blocking layer is shown schematically in FIGS. 17A-17B. First, a 900 nm p-GaN film was grown on the p-SiC substrate. The electron-blocking layer consisted of 40 nm of AlN doped with Mg. The active region consisted of 2 AlGaN quantum wells 3 nm thick and an AlN mole fraction of 40%. As shown in FIG. 17B mesa structure was formed by chlorine-based etching followed by contacting the n-AlGaN with Ti/Al contacts and contacting the p-SiC with Al/Ti contacts. The rectifying behavior of said example device is clearly illustrated by the IV characteristic shown in FIG. 17C. The UV electroluminescence spectrum of said example device is shown in FIG. 17D. The band structure of said example device is expected to follow that of the calculated band structure of a slightly different device shown in FIG. 16B.

Example 3

Superlattice DBRs and repeated graded layer DBRs have been grown as schematically shown in FIG. 18. The reflectance properties were measured using a CARY 5000 UV/Vis/NIR spectrophotometer at near-normal incidence (8 degrees), and referenced to a deep UV (DUV) enhanced Al mirror baseline which we assumed was 80% reflective in the DUV. The superlattice DBR was composed of bilayers SL-A and SL-B, where SL-A is ($Al_{0.70}Ga_{0.30}N/Al_{0.90}Ga_{0.10}N$—0.8/0.8 nm) and SL-B is ($Al_{0.70}Ga_{0.30}N/Al_{0.50}Ga_{0.50}N$—0.8/0.8 nm). Each SL contained 17 bilayers, giving each DBR bilayer a nominal thickness 54 nm. The experimental and the predicted (by the transfer matrix method) reflectance spectra of the superlattice DBR is shown in FIG. 19A with a peak reflectance of 42%. DBRs with sinusoidal, triangular, and sawtooth graded AlGaN composition profiles were grown along with a square (traditional DBR) compositional profile. Each DBR had a minimum AlN mole fraction of 50% and a maximum AlN mole fraction of 85%. The transfer matrix method was employed to determine that the periodicity for the profiles should all be approximately 59 nm to produce reflectivity peaks centered at 280 nm. The experimental and predicted (by the transfer matrix method) reflectance spectra are shown in FIGS. 19B-19E. These findings for both the superlattice and graded composition DBRs are consistent with what is expected from predictions based on the transfer matrix method. DBRs with more layers will yield DBRs with even higher reflectivity values.

Figure 16C:
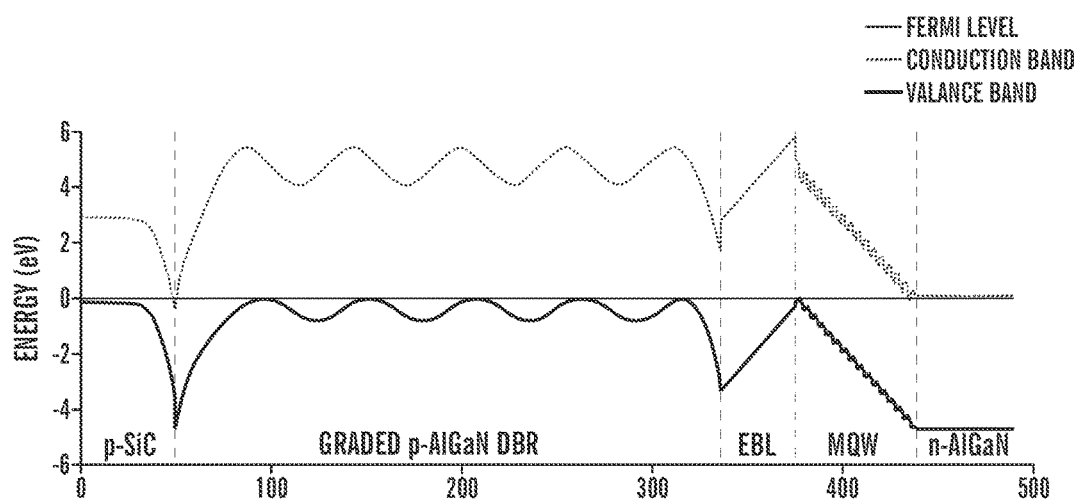
Figure 16D:
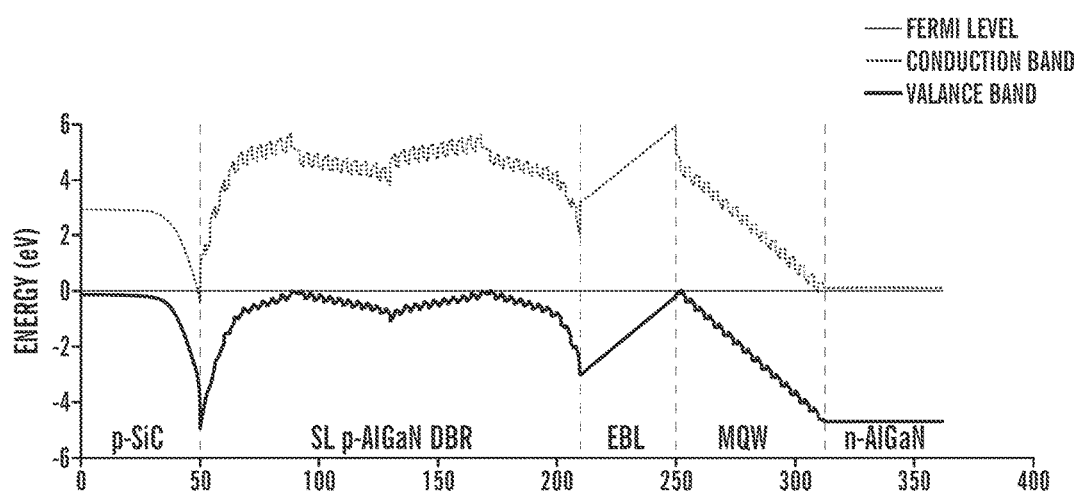

FIG. 16D shows the equilibrium band diagram of an embodiment of this invention in the form of UV-LED incorporating p-type conductive superlattice based DBRs. The simulated device contains a simplified structure to illustrate what occurs within the superlattice DBR. This simulated DBR consists of 2 DBR bilayers (SL-A/SL-B), each superlattice itself containing 10 superlattice bilayers (barrier/well) where SL-A is $Al_{0.50}Ga_{0.50}N$ (2 nm)/$Al_{0.7}Ga_{0.3}N$ (2 nm) and SL-B is $Al_{0.70}Ga_{0.30}N$ (2 nm)/$Al_{0.90}Ga_{0.10}N$ (2 nm). FIG. 16C similarly shows the calculated band structure for an embodiment of this invention that includes a DBR with an AlGaN composition varying approximately sinusoidally from 50% to 85% AlN mole fraction and a period of 56 nm.

Other embodiments are within the scope and spirit of the invention. Features implementing functions may also be physically located at various positions, including being distributed such that portions of functions are implemented at different physical locations.

Further, while the description above refers to the invention, the description may include more than one invention.

REFERENCES

Each of the Following References are Incorporated by Reference in their Entirety 1. Jacques I. Pankove and Theodore D. Moustakas, Gallium Nitride (GaN) I. Academic Press, January 1998.
2. Jacques I. Pankove and Theodore D. Moustakas, Gallium-Nitride (GaN) II. Academic Press, October 1998.
3. Hadis Morkọc. Handbook of Nitride Semiconductors and Devices, GaN-based Optical and Electronic Devices. John Wiley & Sons, December 2008.
4. Shuji Nakamura, Stephen Pearton, and Gerhard Fasol. The Blue Laser Diode: The Complete Story. Springer, October 2000.
5. James R. Grandusky, Jianfeng Chen, Shawn R. Gibb, Mark C. Mendrick, Craig G. Moe, Lee Rodak, Gregory A. Garrett, Michael Wraback, and Leo J. Schowalter. 270 nm pseudomorphic ultraviolet light-emitting diodes with over 60 mW continuous wave output power. Applied Physics Express, 6(3):032101, 2013.
6. Toni Kinoshita, Keiichiro Hironaka, Toshiyuki Obata, Toni Nagashima, Rafael Dalmau, Raoul Schlesser, Baxter Moody, Jinqiao Xie, Shin-ichiro Inoue, Yoshinao Kumagai, Akinori Koukitu, and Zlatko Sitar. Deep-ultraviolet light-emitting diodes fabricated on AN substrates prepared by hydride vapor phase epitaxy. Applied Physics Express, 5(12):122101, 2012.
7. Myunghee Kim, Takehiko Fujita, Shinya Fukahori, Tetsuhiko Inazu, Cyril Pernot, Yosuke Nagasawa, Akira Hirano, Masamichi Ippommatsu, Motoaki Iwaya, Tetsuya Takeuchi, Satoshi Kamiyama, Masahito Yamaguchi, Yoshio Honda, Hiroshi Amano, and Isamu Akasaki.

AlGaN-based deep ultraviolet light-emitting diodes fabricated on patterned sapphire substrates. Applied Physics Express, 4(9):092102, 2011.
8. Seongmo Hwang, Daniel MorGaN, Amanda Kesler, Mohamed Lachab, Bin Zhang, Ahmad Heidari, Haseeb Nazir, Iftikhar Ahmad, Joe Dion, Qhalid Fareed, Vinod Adivarahan, Monirul Islam, and Asif Khan. 276 nm substrate-free flip-chip AlGaN light-emitting diodes. Applied Physics Express, 4(3):032102, 2011.
9. Max Shatalov, Wenhong Sun, Alex Lunev, Xuhong Hu, Alex Dobrinsky, Yuri Bilenko, Jinwei Yang, Michael Shur, Remis Gaska, Craig Moe, Gregory Garrett, and Michael Wraback. AlGaN deep-ultraviolet light-emitting diodes with external quantum efficiency above 10%. Applied Physics Express, 5(8):082101, 2012.
10. Asif Khan, Krishnan Balakrishnan, and Tom Katona. Ultraviolet light-emitting diodes based on group three nitrides. Nature Photonics, 2(2):77-84, 2008.
11. Cyril Pernot, Myunghee Kim, Shinya Fukahori, Tetsuhiko Inazu, Takehiko Fujita, Yosuke Nagasawa, Akira Hirano, Masamichi Ippommatsu, Motoaki Iwaya, Satoshi Kamiyama, Isamu Akasaki, and Hiroshi Amano. Improved efficiency of 255-280 nm AlGaN-Based light-emitting diodes. Applied Physics Express, 3(6):061004, 2010.
12. Hideki Hirayama, Yusuke Tsukada, Tetsutoshi Maeda, and Norihiko Kamata. Marked enhancement in the efficiency of deep-ultraviolet AlGaN light-emitting diodes by using a multiquantum-barrier electron blocking layer. Applied Physics Express, 3(3):031002, 2010.
13. C. G. Moe, H. Masui, M. C. Schmidt, L. Shen, B. Moran, S. Newman, K. Vampola, T. Mates, S. Keller, J. S. Speck, S. P. DenBaars, C. Hussel, and D. Emerson. Milliwatt power deep ultraviolet light emitting diodes grown on Silicon Carbide. Japanese Journal of Applied Physics, 44:L502-L504, 2005.
14. Theodore D. Moustakas and Anirban Bhattacharyya. Experimental evidence that the plasma-assisted MBE growth of nitride alloys is a liquid phase epitaxy process. ECS Transactions, 35(6):63-71, April 2011.
15. Theodore D. Moustakas and Anirban Bhattacharyya. The role of liquid phase epitaxy during growth of AlGaN by MBE. physica status solidi (c), 9(3-4):580-583, 2012.
16. Shigefusa F. Chichibu, Akira Uedono, Takeyoshi Onuma, Benjamin A. Haskell, Arpan Chakraborty, Takahiro Koyama, Paul T. Fini, Stacia Keller, Steven P. DenBaars, James S. Speck, Umesh K. Mishra, Shuji Nakamura, Shigeo Yamaguchi, Satoshi Kamiyama, Hiroshi Amano, Isamu Akasaki, Jung Han, and Takayuki Sota. Origin of defect-insensitive emission probability in in-containing (Al,In,Ga)N alloy semiconductors. Nature Materials, 5(10):810-816, 2006.
17. I-hsiu Ho and G. B. Stringfellow. Solid phase immiscibility in GaInN. Applied Physics Letters, 69(18):2701-2703, October 1996.
18. R. Singh, D. Doppalapudi, T. D. Moustakas, and L. T. Romano. Phase separation in InGaN thick films and formation of InGaN/GaN double heterostructures in the entire alloy composition. Applied Physics Letters, 70(9): 1089-1091, March 1997.
19. R. Singh and T. D. Moustakas. Growth of InGaN films by MBE at the growth temperature of GaN. MRS Online Proceedings Library, 395, 1995.
20. D. Doppalapudi, S. N. Basu, K. F. Ludwig, and T. D. Moustakas. Phase separation and ordering in InGaN alloys grown by molecular beam epitaxy. Journal of Applied Physics, 84(3):1389-1395, August 1998.
21. Archibald Nelson Wright and Carl A. Winkler. Active Nitrogen. Academic Press, 1968.
22. Theodore D Moustakas. The role of extended defects on the performance of optoelectronic devices in nitride semiconductors. physica status solidi (a), 210(1):169-174, 2013.
23. W. D. Nix and B. M. Clemens. Crystallite coalescence: A mechanism for intrinsic tensile stresses in thin films. Journal of Materials Research, 14(08):3467-3473, 1999.
24. Yitao Liao, Development of Efficient Deep Ultraviolet Light Emitting Diodes. Ph.D., Boston University, United States—Massachusetts, 2011.
25. J Mickevicius, G Tamulaitis, M Shur, M Shatalov, J Yang, and R Gaska. Internal quantum efficiency in AlGaN with strong carrier localization. Applied Physics Letters, 101:211902, 2012.
26. E. Iliopoulos and T. D. Moustakas. Growth kinetics of AlGaN films by plasma-assisted molecular beam epitaxy. Applied Physics Letters, 81(2):295-297, July 2002.
27. A. Bhattacharyya, T. D. Moustakas, Lin Zhou, David J. Smith, and W. Hug. Deep ultraviolet emitting AlGaN quantum wells with high internal quantum efficiency. Applied Physics Letters, 94(18):181907-181907-3, May 2009.
28. M. Shatalov, A. Lunev, X. Hu, O. Bilenko, I. Gaska, W. Sun, J. Yang, A. Dobrinsky, Y. Bilenko, R. Gaska, and M. Shur. Performance and applications of deep UV LED. International Journal of High Speed Electronics and Systems, 21(01):1250011, 2012.
29. Noritoshi Maeda and Hideki Hirayama. Realization of high-efficiency deep-UV LEDs using trans-parent p-AlGaN contact layer. physica status solidi (c), pages n/a-n/a, 2013.
30. M. Khizar, Z. Y. Fan, K. H. Kim, J. Y. Lin, and H. X. Jiang. Nitride deep-ultraviolet light-emitting diodes with microlens array. Applied Physics Letters, 86(17), 2005.
31. M. Lachab, F. Asif, B. Zhang, I. Ahmad, A. Heidari, Q. Fareed, V. Adivarahan, and A. Khan. Enhancement of light extraction efficiency in sub-300 nm nitride thin-film flip-chip light-emitting diodes. Solid-State Electronics, 89(0):156-160, 2013.
32. Jonathan J Wierer, Aurelien David, and Mischa M Megens. III-Nitride photonic-crystal light-emitting diodes with high extraction efficiency. Nature Photonics, 3(3): 163-169, 2009.
33. T. N. Oder, K H Kim, J Y Lin, and H X Jiang. III-Nitride blue and ultraviolet photonic crystal light emitting diodes. Applied Physics Letters, 84(4): 466-468, 2004.
34. T. N. Oder, J. Shakya, J. Y. Lin, and H. X. Jiang. III-Nitride photonic crystals. Applied Physics Letters, 83(6): 1231-1233, 2003.
35. Xianfeng Ni, Qian Fan, Ryoko Shimada, Umit Ozgur, and Hadis Morkoc. Reduction of efficiency droop in inGaN light emitting diodes by coupled quantum wells. Applied Physics Letters, 93(17) 2008.
36. Jinqiao Xie, Xianfeng Ni, Qian Fan, Ryoko Shimada, Umit Ozgur, and Hadis Morkoc. On the efficiency droop in inGaN multiple quantum well blue light emitting diodes and its reduction with p-doped quantum well barriers. Applied Physics Letters, 93(12), 2008.
37. M. L. Reed, E. D. Readinger, H. Shen, M. Wraback, A. Syrkin, A. Usikov, O. V. Kovalenkov, and V. A. Dmitriev. n-InGaN/p-GaN single heterostructure light emitting diode with p-side down. Applied Physics Letters, 93(13), 2008.
38. M. L. Reed, E. D. Readinger, C. G. Moe, H. Shen, M. Wraback, A. Syrkin, A. Usikov, O. V. Kovalenkov, and V.

A. Dmitriev. Benefits of negative polarization charge in n-InGaN on p-GaN single heterostructure light emitting diode with p-side down. physica status solidi (c), 6(2): 585-588, 2009.

39. Scott Newman, Chad Gallinat, Jonathan Wright, Ryan Enck, Anand Sampath, Hongen Shen, Meredith Reed, and Michael Wraback. Wavelength stable, p-side-down green light emitting diodes grown by molecular beam epitaxy. Journal of Vacuum Science and Technology B, 31(1), 2013.

40. V Ramachandran, R M Feenstra, W L Sarney, L Salamanca-Riba, J E Northrup, L T Romano, and D W Greve. Inversion of wurtzite GaN (0001) by exposure to magnesium. Applied physics letters, 75(6):808-810, 1999.

41. I. D. Goepfert, E. F. Schubert, A. Osinsky, P. E. Norris, and N. N. Faleev. Experimental and theoretical study of acceptor activation and transport properties in p-type $Al_xGa_{1-x}N$/GaN superlattices. Journal of Applied Physics, 88(4), 2000.

42. Peter Kozodoy, Monica Hansen, Steven P. DenBaars, and Umesh K. Mishra. Enhanced Mg doping efficiency in $Al_{0.2}Ga_{0.8}N$/GaN superlattices. Applied Physics Letters, 74(24), 1999.

43. John Simon, Vladimir Protasenko, Chuanxin Lian, Huili Xing, and Debdeep Jena. Polarization-induced hole doping in wide-band-gap uniaxial semiconductor heterostructures. Science, 327(5961):60-64, 2010.

44. D. Brunner, H. Angerer, E. Bustarret, F. Freudenberg, R. Hopler, R. Dimitrov, O. Ambacher, and M. Stutzmann. Optical constants of epitaxial AlGaN films and their temperature dependence. Journal of Applied Physics, 82(10), 1997.

45. C. Cobet, K. Wilmers, T. Wethkamp, N. V. Edwards, N. Esser, and W. Richter. Optical properties of SiC investigated by spectroscopic ellipsometry from 3.5 to 10 eV. Thin Solid Films, 364(12):111-113, 2000.

46. B. Cheng, S. Choi, J. E. Northrup, Z. Yang, C. Knollenberg, M. Teepe, T. Wunderer, C. L. Chua, and N. M. Johnson. Enhanced vertical and lateral hole transport in high aluminum-containing AlGaN for deep ultraviolet light emitters. Applied Physics Letters, 102(23), 2013.

47. J. D. Simon. Polarization-engineered III-V nitride heterostructure devices by molecular beam epitaxy. PhD thesis, University of Notre Dame, 2009.

48. J Pankove, S S Chang, H C Lee, R J Molnar, T D Moustakas, and B Van Zeghbroeck. High-temperature GaN/SiC heterojunction bipolar transistor with high gain. In Electron Devices Meeting, 1994. IEDM '94. Technical Digest., International, pages 389-392. IEEE, 1994.

49. Wei Zhang, A. Yu. Nikiforov, C. Thomidis, J. Woodward, H. Sun, Chen-Kai Kao, D. Bhattarai, A. Moldawer, L. Zhou, D. J. Smith, and T. D. Moustakas. Molecular beam epitaxy growth of AlGaN quantum wells on 6H-SiC substrates with high internal quantum efficiency. Journal of Vacuum Science and Technology B, 30(2):-, 2012.

50. Haiding Sun, Jeff Woodward, Jian Yin, Adam Moldawer, Emanuele F Pecora, Alexey Yu Nikiforov, Luca Dal Negro, Roberto Paiella, Karl Ludwig, David J Smith, et al. Development of AlGaN-based graded-index-separate-confinement-heterostructure deep UV emitters by molecular beam epitaxy. Journal of Vacuum Science & Technology B: Microelectronics and Nanometer Structures, 31(3):03C117-03C117, 2013.

51. Jeonghyun Hwang, William J Schaff, Lester F Eastman, Shawn T Bradley, Leonard J Brillson, David C Look, J Wu, Wladek Walukiewicz, Madalina Furis, and Alexander N Cartwright. Si doping of high-Al-mole fraction AlGaN alloys with rf plasma-induced molecular-beam-epitaxy. Applied physics letters, 81:5192, 2002.

52. C Stampfl, J Neugebauer, and Chris G Van de Walle. Doping of $Al_xGa_{1-x}N$ alloys. Materials Science and Engineering-B-Solid State Materials for Advanced Technology, 59(1):253-257, 1998.

53. M D McCluskey, N M Johnson, Chris G Van de Walle, D P Bour, M Kneissl, and W Walukiewicz. Metastability of oxygen donors in AlGaN. Physical review letters, 80(18):4008, 1998.

54. T Xu, C Thomidis, I Friel, and T D Moustakas. Growth and silicon doping of AlGaN films in the entire alloy composition by molecular beam epitaxy. physica status solidi (c), 2(7):2220-2223, 2005.

55. Ryan France, Tao Xu, Papo Chen, R Chandrasekaran, and T D Moustakas. Vanadium-based ohmic contacts to n-AlGaN in the entire alloy composition. Applied physics letters, 90:062115, 2007.

56. J Foresi and T D Moustakas. Metal contacts to gallium nitride. Applied physics letters, 62(22):2859-2861, 1993.

57. Theodore D Moustakas. Nitride semiconductors: Why they work in optoelectronic devices. ECS Transactions, 41(6):3-11, 2011.

58. V. S. Fomenko. Handbook of Thermionic Properties: Electronic Work Functions and Richardson Constants of Elements and Compounds. Plenum, 1966.

59. Chul Huh, Kug-Seung Lee, Eun-Jeong Kang, and Seong-Ju Park. Improved light-output and electrical performance of InGaN-based light-emitting diode by microroughening of the p-GaN surface. Journal of Applied Physics, 93(11):9383-9385, 2003.

60. Michael R Krames and Fred A Kish Jr. Ordered interface texturing for a light emitting device, 1998. U.S. Pat. No. 5,779,924.

61. T D Moustakas, T Lei, and R J Molnar. Growth of GaN by ECR-assisted MBE. Physica B: Condensed Matter, 185(1):36-49, 1993.

62. D Korakakis, K F Ludwig Jr, and T D Moustakas. Long range order in AlGaN films grown by molecular beam epitaxy. Applied physics letters, 71:72, 1997.

63. H M Ng, D Doppalapudi, T D Moustakas, N G Weimann, and L F Eastman. The role of dislocation scattering in n-type GaN films. Applied physics letters, 73(6):821-823, 1998.

64. Nils G Weimann, Lester F Eastman, Dharanipal Doppalapudi, Hock M Ng, and Theodore D Moustakas. Scattering of electrons at threading dislocations in GaN. Journal of Applied Physics, 83(7):3656-3659, 1998.

65. M Misra, A V Sampath, and T D Moustakas. Investigation of vertical transport in n-GaN films grown by molecular beam epitaxy using Schottky barrier diodes. Applied Physics Letters, 76(8):1045-1047, 2000.

66. R J Molnar, R Singh, and T D Moustakas. Blue-violet light emitting gallium nitride p-n junctions grown by electron cyclotron resonance-assisted molecular beam epitaxy. Applied physics letters, 66(3):268-270, 1995.

67. H M Ng, T D Moustakas, and S N G Chu. High reflectivity and broad bandwidth AlN/GaN distributed Bragg reflectors grown by molecular-beam epitaxy. Applied Physics Letters, 76(20):2818-2820, 2000.

68. Hock Min Ng and Theodore D Moustakas. Group-III nitride VCSEL structures grown by molecular beam epitaxy. In Symposium on Integrated Optoelectronics, pages 22-27, 2000.

69. Yitao Liao, Christos Thomidis, Chen Kai Kao, Adam Moldawer, Wei Zhang, Yi-chung Chang, A Yu Nikiforov, Enrico Bellotti, and Theodore D Moustakas. Milliwatt power AlGaN-based deep ultraviolet light emitting diodes by plasma-assisted molecular beam epitaxy. physica status solidi (RRL)-Rapid Research Letters, 4(1-2):49-51, 2010.
70. Yitao Liao, Christos Thomidis, Chen-kai Kao, and Theodore D Moustakas. AlGaN based deep ultraviolet light emitting diodes with high internal quantum efficiency grown by molecular beam epitaxy. Applied Physics Letters, 98:081110, 2011.
71. Theodore D Moustakas, Yitao Liao, Chen-kai Kao, Christos Thomidis, Anirban Bhattacharyya, Dipesh Bhattarai, and Adam Moldawer. Deep UV-LEDs with high IQE based on AlGaN alloys with strong band structure potential fluctuations. In SPIE OPTO, pages 82780L-82780L, 2012.
72. J S Cabalu, C Thomidis, T D Moustakas, S Riyopoulos, Lin Zhou, and David J Smith. Enhanced internal quantum efficiency and light extraction efficiency from textured GaN/AlGaN quantum wells grown by molecular beam epitaxy. Journal of applied physics, 99:064904, 2006.
73. Ryan France, Tao Xu, Papo Chen, R. Chandrasekaran and T. D. Moustakas, "Vanadium-based Ohmic contacts to n-AlGaN in the entire alloy composition", Appl. Phys. Lett. 90, 062115 (2007)

What is claimed is:

1. A deep ultraviolet light-emitting diode comprising:
a base layer including a p-type material forming a first side of the diode;
an active layer grown on the base layer, whereby radiative recombination of carriers in the active layer produces ultraviolet light in response to an applied electric field;
a light reflecting layer disposed between the base layer and the active layer, wherein the light reflecting layer reflects the ultraviolet light away from the base layer, and
an n-AlGaN layer grown on the active layer, wherein the n-AlGaN is on a second side of the diode which is opposite to the first side, and wherein the active layer is disposed between the base layer and the n-AlGaN layer and wherein the n-AlGaN layer includes a textured surface, whereby ultraviolet light is emitted from the textured surface.

2. The ultraviolet light-emitting diode of claim 1, wherein the p-type material is SiC or AlGaN.

3. The ultraviolet light-emitting diode of claim 1, wherein the light-reflecting layer includes at least one p-type electrically conductive AlGaN distributed Bragg reflector (DBR), whereby the p-type DBR effectively reflects the ultraviolet light away from the base layer.

4. The ultraviolet light-emitting diode of claim 3, wherein the p-type DBR has a peak reflectance substantially similar to the wavelength of the ultraviolet light produced by the active layer.

5. The ultraviolet light-emitting diode of claim 3, wherein the p-type DBR comprises a plurality of alternating first layers and second layers having different refractive indices, wherein the first layer and the second layer each comprises a plurality of alternating layers having different spontaneous polarizations.

6. The ultraviolet light-emitting diode of claim 3, wherein the p-type DBR comprises a plurality of repeating layers, wherein each layer is graded in composition between at least two materials with different spontaneous polarizations.

7. The ultraviolet light-emitting diode of claim 1, further comprising an electron-blocking layer disposed between the light-reflecting layer and the active layer.

8. The ultraviolet light-emitting diode of claim 7, wherein the electron blocking layer is p-doped or undoped.

9. The ultraviolet light-emitting diode of claim 1, wherein the active layer substantially comprises AlGaN, InAlN, or InAlGaN.

10. The ultraviolet light-emitting diode of claim 1, wherein the active layer comprises a single quantum well.

11. The ultraviolet light-emitting diode of claim 1, wherein the active layer comprises a plurality of quantum wells.

12. The ultraviolet light-emitting diode of claim 1, wherein the active layer comprises a plurality of quantum dots.

13. The ultraviolet light-emitting diode of claim 1, wherein the textured surface has a random texture.

14. The ultraviolet light-emitting diode of claim 1, wherein the textured surface has a patterned texture.

15. The ultraviolet light-emitting diode of claim 14, wherein the patterned texture comprises a micro lens array.

16. The ultraviolet light-emitting diode of claim 14, wherein the patterned texture comprises a photonic crystal.

17. The ultraviolet light-emitting diode of claim 1, further comprising an n-type electrically conductive anti-reflective coating layer in contact with the n-AlGaN layer, such that the n-AlGaN layer is disposed in between the active layer and the anti-reflective coating layer.

18. The ultraviolet light-emitting diode of claim 1, wherein the diode produces ultraviolet light in the range of 210 nm to 365 nm.

19. The ultraviolet light-emitting diode of claim 1, wherein the diode produces ultraviolet light in the range of 250 nm to 300 nm.

* * * * *